United States Patent
Nosaka

(10) Patent No.: US 10,833,651 B2
(45) Date of Patent: Nov. 10, 2020

(54) MULTIPLEXER, RADIO-FREQUENCY FRONT END CIRCUIT, AND COMMUNICATION APPARATUS

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/720,002

(22) Filed: Dec. 19, 2019

(65) Prior Publication Data
US 2020/0204156 A1    Jun. 25, 2020

(30) Foreign Application Priority Data

Dec. 25, 2018  (JP) .................................. 2018-240954

(51) Int. Cl.
  *H04B 1/38*   (2015.01)
  *H03H 9/64*   (2006.01)
  *H04B 1/40*   (2015.01)
  *H04B 1/00*   (2006.01)

(52) U.S. Cl.
  CPC ......... *H03H 9/6479* (2013.01); *H04B 1/0057* (2013.01); *H04B 1/40* (2013.01)

(58) Field of Classification Search
  CPC ....... H03H 9/6479; H04B 1/0057; H04B 1/40
  USPC .......................................................... 455/73
  See application file for complete search history.

(56) References Cited

U.S. PATENT DOCUMENTS

| | | | | |
|---|---|---|---|---|
| 6,922,117 | B2* | 7/2005 | Karlquist | H03H 9/703 333/132 |
| 8,193,877 | B2* | 6/2012 | Fritz | H03H 9/706 333/133 |
| 9,038,005 | B2* | 5/2015 | Turner | H03H 9/46 716/104 |
| 9,214,920 | B2* | 12/2015 | Link | H01Q 21/50 |
| 9,425,764 | B2* | 8/2016 | Burak | H03H 9/02118 |
| 9,444,426 | B2* | 9/2016 | Burak | H03H 9/173 |
| 9,787,283 | B2* | 10/2017 | Tsuzuki | G06F 30/394 |
| 10,141,643 | B2* | 11/2018 | Fujiwara | H04B 1/006 |
| 10,148,249 | B2* | 12/2018 | Yoshimura | H03H 1/0007 |
| 10,361,679 | B2* | 7/2019 | Takata | H03H 9/6483 |
| 10,530,336 | B2* | 1/2020 | Takamine | H03H 9/145 |

(Continued)

FOREIGN PATENT DOCUMENTS

JP    2017-152881 A    8/2017

*Primary Examiner* — April G Gonzales
(74) *Attorney, Agent, or Firm* — Xsensus LLP

(57) ABSTRACT

A multiplexer includes a common terminal, a first terminal, a second terminal, and a third terminal, a first filter, a second filter, and a third filter. With a frequency f3 being defined as $M \times f1 \pm N \times f2$ or $M \times f2 \pm N \times f1$, M and N being natural numbers, f1 being a frequency included in a first passband of the first filter and f2 being a frequency included in a second passband of the second filter, at least a part of a range of frequency f3 overlaps a third passband of the third filter. No acoustic wave resonator is connected between the common terminal and a first parallel arm resonance circuit. A combined capacitance of the first parallel arm resonance circuit is higher than a minimum value of a combined capacitance of each of at least one first serial arm resonance circuit.

19 Claims, 18 Drawing Sheets

(56) References Cited

U.S. PATENT DOCUMENTS

| | | | |
|---|---|---|---|
| 2006/0019611 A1* | 1/2006 | Mages | H04B 1/52 455/73 |
| 2017/0331457 A1* | 11/2017 | Satoh | H03H 9/605 |
| 2018/0026605 A1* | 1/2018 | Ito | H01Q 1/2283 367/135 |
| 2018/0069529 A1* | 3/2018 | Bi | H03H 9/14561 |
| 2018/0219517 A1* | 8/2018 | Nagatani | H03K 19/013 |
| 2018/0262179 A1* | 9/2018 | Goto | H03H 9/6489 |

* cited by examiner (a)

(b)

(a)

IMPEDANCE OF ELASTIC WAVE RESONATOR($\Omega$)

(b)

CURRENT THROUGH ACOUSTIC PATH(A)

(c)

CURRENT DENSITY IN ACOUSTIC PATH (A/pF)

FREQUENCY(GHz)

(a)

(b)

(c)

(d)

(a)

(b)

(c)

(d)

MULTIPLEXER, RADIO-FREQUENCY FRONT END CIRCUIT, AND COMMUNICATION APPARATUS

CROSS REFERENCE TO RELATED APPLICATION

The present application claims priority to Japanese patent application serial no. 2018-240954, filed in the Japanese Patent Office on Dec. 25, 2018, the entire contents of which being incorporated herein by reference. Also, the present application contains subject matter related to that in U.S. application Ser. No. xxx,xxx, entitled Multiplexer, Radio-Frequency Front End Circuit, and Communication Apparatus, having common inventorship and bearing Attorney docket number 13450US01, the entire contents of which being incorporate herein by reference

BACKGROUND

Technical Field

The present disclosure relates to a multiplexer capable of transmitting signals in a plurality of frequency bands, a radio-frequency front end circuit, and a communication apparatus.

Description of the Background Art

A multiplexer capable of transmitting signals in a plurality of frequency bands has conventionally been known. For example, Japanese Patent Laid-Open No. 2017-152881 discloses a multiplexer including two transmission filters, two reception filters, and one transmission and reception filter. As inductance elements are arranged in series between one of the plurality of filters and a common terminal, insertion loss in a passband of each filter can be reduced even though the number of frequency bands used by the multiplexer is increased.

SUMMARY

Each of the plurality of filters included in the multiplexer disclosed in Japanese Patent Laid-Open No. 2017-152881 is an acoustic wave filter formed from an acoustic wave resonator. An elastic constant of the acoustic wave resonator has been known to be non-linear. When intermodulation distortion (IMD) of two transmission signals originating from such non-linearity occurs in a frequency band of a reception signal, reception sensitivity of the multiplexer is deteriorated. As recognized by the present inventor, Japanese Patent Laid-Open No. 2017-152881, however, is silent about deterioration of reception sensitivity due to IMD of two transmission signals.

The present disclosure was made to solve the problem recognized by the present inventor, as described above, and therefore an aspect of the present disclosure is to suppress deterioration of reception sensitivity of a multiplexer.

A multiplexer according to the present disclosure includes a common terminal, a first terminal, a second terminal, and a third terminal, a first filter, a second filter, and a third filter. The first filter is connected between the common terminal and the first terminal and has a first passband. The second filter is connected between the common terminal and the second terminal and has a second passband not overlapping the first passband. Passbands that do not overlap is intended to be construed with reference to filter characteristics of two filters with passbands defined by their respective 3 dB points. The third filter is connected between the common terminal and the third terminal and has a third passband overlapping neither the first passband nor the second passband. With a frequency f3 being defined as $M \times f1 \pm N \times f2$ or $M \times f2 \pm N \times f1$, wherein M and N being natural numbers, f1 being a frequency included in the first passband and f2 being a frequency included in the second passband, at least a part of a range of frequency f3 overlaps the third passband. The first filter includes at least one first serial arm resonance circuit and a first parallel arm resonance circuit. The at least one first serial arm resonance circuit is connected between the common terminal and the first terminal. The first parallel arm resonance circuit is connected between the common terminal and a grounding point and includes at least one acoustic wave resonator. No acoustic wave resonator is connected between the common terminal and the first parallel arm resonance circuit. A combined capacitance of the first parallel arm resonance circuit is higher than a minimum value of a combined capacitance of each of the at least one first serial arm resonance circuit.

According to an exemplary multiplexer described in the present disclosure, a combined capacitance of the first parallel arm resonance circuit is higher than a minimum value of a combined capacitance of each of at least one first serial arm resonance circuit so that deterioration of reception sensitivity can be suppressed.

The foregoing and other objects, features, aspects and advantages of the present disclosure will become more apparent from the following detailed description of the present disclosure when taken in conjunction with the accompanying drawings.

DESCRIPTION OF EMBODIMENTS

Figure 1:
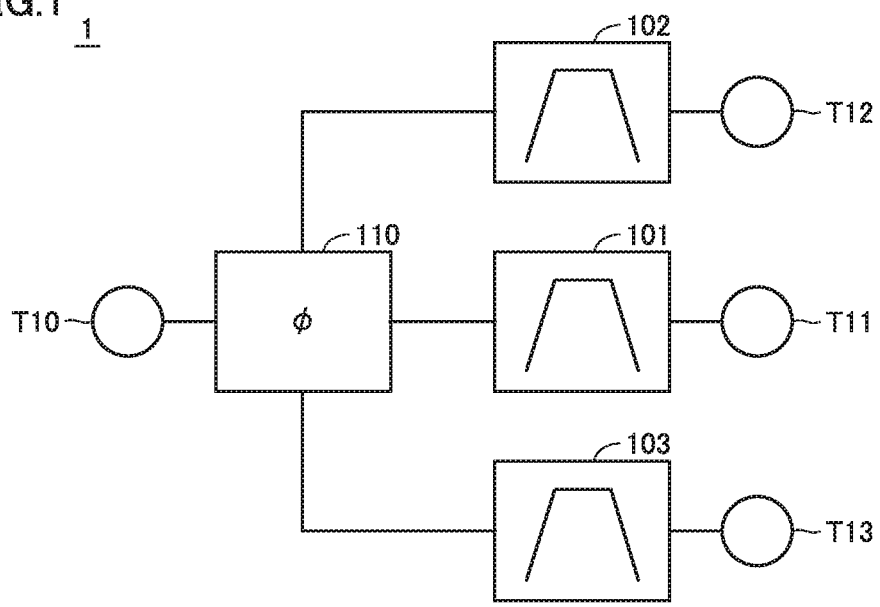
FIG. 1 is a circuit configuration diagram of a multiplexer according to a first embodiment.

An embodiment will be described in detail below with reference to the drawings. The same or corresponding elements in the drawings have the same reference characters allotted and description thereof will not be repeated in principle. Connection between two circuit elements encompasses both of direct connection between the two circuit elements and indirect connection therebetween with another circuit element being interposed. A resonance circuit may be formed from a single resonator. When a resonance circuit is formed from a single resonator, a combined capacitance of the resonance circuit means a damping capacitance of the resonator included in the resonance circuit. When a resonance circuit is formed from a plurality of resonators, a combined capacitance of the resonance circuit is calculated based on a damping capacitance of each of the plurality of resonators included in the resonance circuit.

First Embodiment

FIG. 1 is a circuit configuration diagram of a multiplexer 1 according to a first embodiment. As shown in FIG. 1, multiplexer 1 includes a common terminal T10 (a common terminal), a terminal T11 (a first terminal), a terminal T12 (a second terminal), a terminal T13 (a third terminal), a transmission filter 101 (a first filter), a transmission filter 102 (a second filter), a reception filter 103 (a third filter), and a phase shifter 110.

Common terminal T10 is connected to phase shifter 110. Transmission filter 101 is connected to phase shifter 110 and terminal T11, between common terminal T10 and terminal T11. Transmission filter 102 is connected to phase shifter 110 and terminal T12, between common terminal T10 and terminal T12. Reception filter 103 is connected to phase shifter 110 and terminal T13, between common terminal T10 and terminal T13. Phase shifter 110 may be provided as necessary and it is not an essential feature. Furthermore, the language "connected between" (in the context of a connection between two terminals, or a terminal and a filter) is used to describe a direct connection, or the optional phase shifter 110 as part of the connection. Moreover, as an example, transmission filter 101 being connected between terminals T10 and T11, should be construed as meaning that the transmission filter 101 is either directly connected to T10 and T11, or not (e.g., with the phase shifter 110 inserted between filter 101 and terminal T10).

In multiplexer 1, a passband of transmission filter 101 (a first passband) and a passband of transmission filter 102 (a second passband) are each a frequency band of a transmission signal (a transmission band). A passband of reception filter 103 (a third passband) is a frequency band of a reception signal (a reception band).

The passband of transmission filter 102 does not overlap the passband of transmission filter 101. The passband of reception filter 103 overlaps neither of the passband of transmission filter 101 and the passband of transmission filter 102.

Multiplexer 1 can simultaneously transmit a signal in the passband of transmission filter 101 input from terminal T11 and a signal in the passband of transmission filter 102 input from terminal T12. In other words, multiplexer 1 is adapted to 2 up link carrier aggregation (2ULCA).

Figure 2:
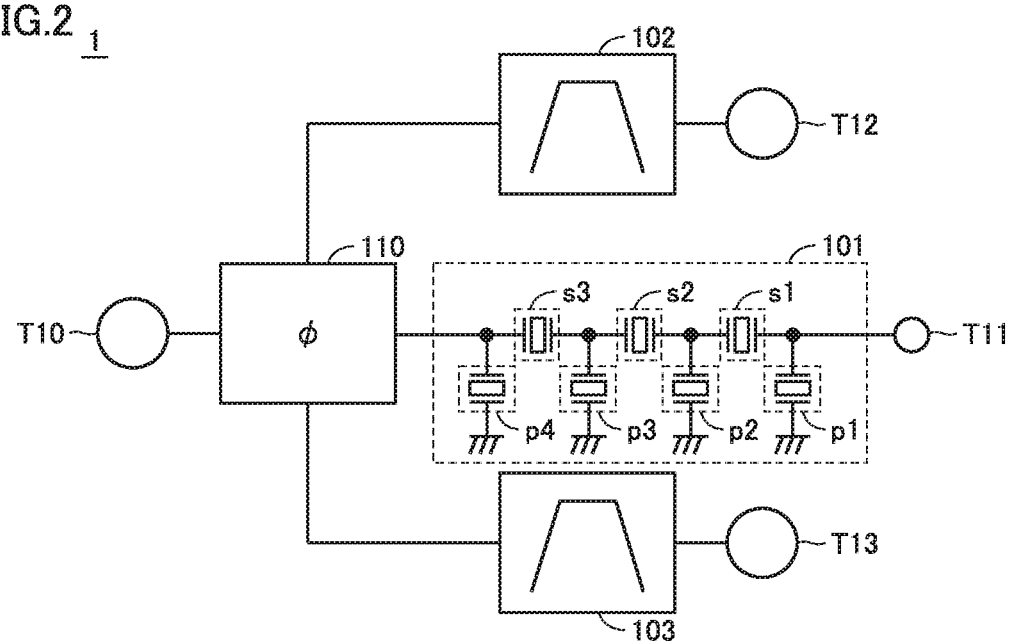
FIG. 2 is a diagram showing a specific circuit configuration of a transmission filter in FIG. 1.

FIG. 2 is a diagram showing a specific circuit configuration of transmission filter 101 in FIG. 1. As shown in FIG. 2, transmission filter 101 includes serial arm resonators s1 to s3 (a first serial arm resonance circuit), parallel arm resonators p1 to p3, and a parallel arm resonator p4 (a first parallel arm resonance circuit). Transmission filter 101 is an acoustic wave filter formed from an acoustic wave resonator. Examples of the acoustic wave resonator include a surface acoustic wave (SAW) resonator, a bulk acoustic wave (BAW) resonator, a film bulk acoustic wave resonator (FBAR), or a solidly mounted (SM) resonator.

Serial arm resonators s1 to s3 are connected in series in this order between terminal T11 and phase shifter 110. Parallel arm resonator p1 is connected between a grounding point and a connection node between terminal T11 and serial arm resonator s1. Parallel arm resonator p2 is connected between the grounding point and a connection node between serial arm resonators s1 and s2. Parallel arm resonator p3 is connected between the grounding point and a connection node between serial arm resonators s2 and s3. Parallel arm resonator p4 is connected between the grounding point and a connection node between serial arm resonator s3 and phase shifter 110. No acoustic wave resonator is connected between common terminal T10 and parallel arm resonator p4.

A transmission signal (a transmission signal in the first passband) input from terminal T11 passes through transmission filter 101 and is reflected by transmission filter 102 and reception filter 103 and output from common terminal T10.

A transmission signal (a transmission signal in the second passband) input from terminal T12 passes through transmission filter 102 and is reflected by transmission filter 101 and reception filter 103 and output from common terminal T10. Specifically, a current corresponding to the transmission signal from transmission filter 102 is input to transmission filter 101 and divided into currents to parallel arm resonator p4 and serial arm resonator s3. The transmission signal is reflected mainly by parallel arm resonator p4 and serial arm resonator s3 and output from common terminal T10.

An elastic constant of an acoustic wave resonator has been known to be non-linear. Owing to such non-linearity, IMD of two transmission signals of multiplexer 1 occurs. A frequency f3 of IMD is expressed as M×f1±N×f2 or M×f2±N×f1 (M and N being natural numbers) where f1 represents a frequency included in the passband of transmission filter 101 and f2 represents a frequency included in the passband of transmission filter 102. When a part of a range of frequency f3 overlaps the passband of reception filter 103, IMD occurs in a reception band of multiplexer 1 in transmission of the two transmission signals. In particular, third-order intermodulation distortion (IMD3) where a condition of f3=2×f1−f2 or f3=2×f2−f1 is satisfied occurs in the vicinity of the two transmission bands. Therefore, when the reception band is relatively close to the two transmission bands, IMD3 often gives rise to a problem. Consequently, reception sensitivity of multiplexer 1 is deteriorated.

In multiplexer 1, a part of the range of frequency f3 of IMD3 expressed as 2×f1−f2 overlaps the passband of reception filter 103. Distortion caused by non-linearity of the elastic constant of the acoustic wave resonator tends to be large as the resonance circuit is closer to common terminal T10. In multiplexer 1, a damping capacitance (a capacitance) of parallel arm resonator p4 is set to be higher than a minimum value of a damping capacitance of each of serial arm resonators s1 to s3 so that a current density in parallel arm resonator p4 is lower than a maximum value of a current density in each of serial arm resonators s1 to s3 Since IMD due to the transmission signal from transmission filter 101 and the transmission signal from transmission filter 102 can be suppressed, deterioration of reception sensitivity of multiplexer 1 can be suppressed. IMD that deteriorates reception sensitivity of multiplexer 1 is not limited to IMD3.

Figure 3:
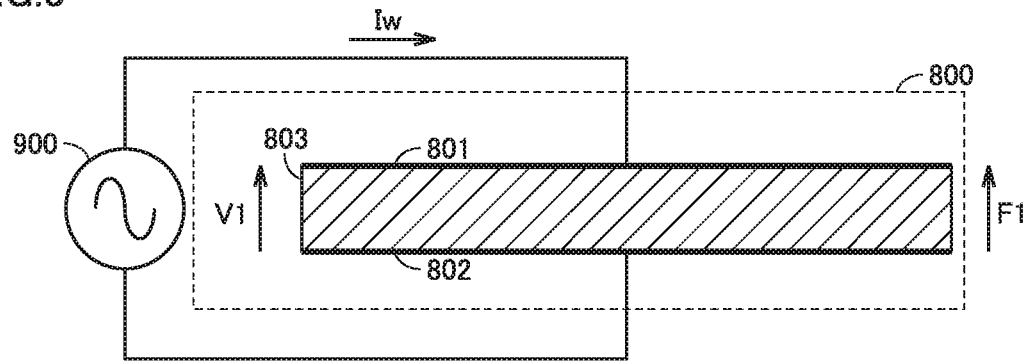
FIG. 3 is a diagram showing application of AC power to an acoustic wave resonator by an AC power supply.

Relation between intermodulation distortion and a current density will be described below with reference to FIGS. 3 to 5. FIG. 3 is a diagram showing application of alternating-current (AC) power to an acoustic wave resonator 800 by an AC power supply 900. FIG. 3 shows BAW acoustic wave resonator 800 by way of example of the acoustic wave resonator. As shown in FIG. 3, acoustic wave resonator 800 includes an electrode 801, an electrode 802, and a piezoelectric body 803. Piezoelectric body 803 is formed between electrode 801 and electrode 802. As AC power is applied across electrodes 801 and 802, a voltage V1 corresponding to AC power is generated across electrodes 801 and 802 and a current Iw is input to acoustic wave resonator 800. Consequently, acoustic wave resonator 800 is excited at magnitude of force F1.

Figure 4:
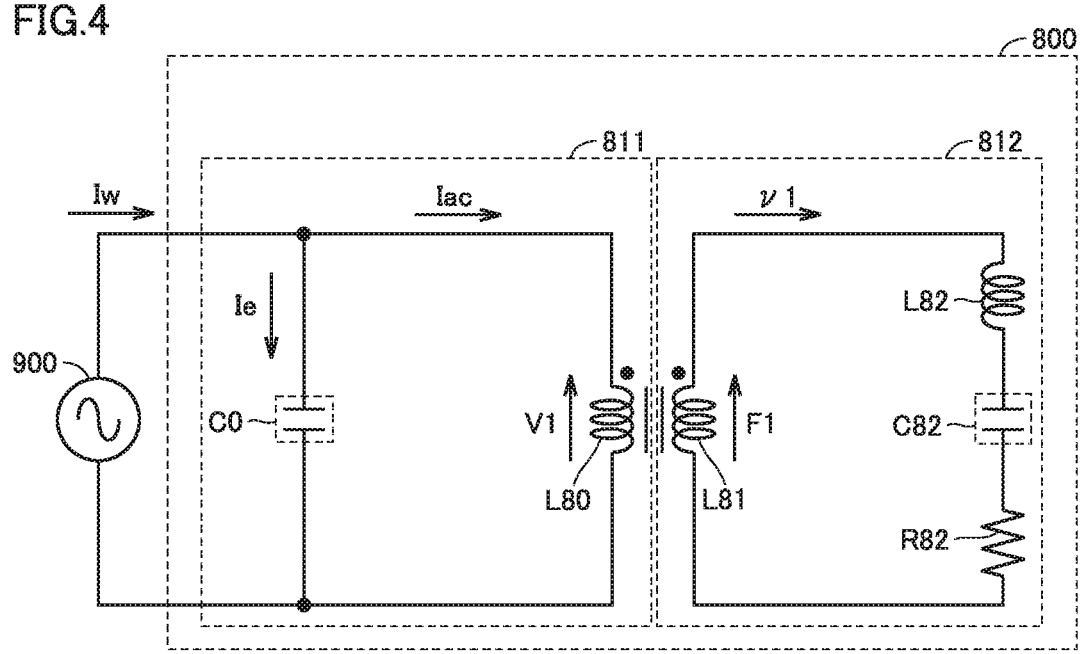
FIG. 4 is a diagram expressing relation between AC power and excitation in the configuration shown in FIG. 3 by using an electric circuit and a mechanical circuit.

FIG. 4 is a diagram expressing relation between AC power and excitation in the configuration shown in FIG. 3 by using an electric circuit 811 and a mechanical circuit 812. As shown in FIG. 4, electric circuit 811 includes a capacitor C0 and an inductor L80. Capacitor C0 and inductor L80 are connected in parallel between opposing ends of AC power supply 900. A capacity of capacitor C0 is a damping capacitance representing a capacitive component of acoustic wave resonator 800.

Mechanical circuit 812 includes an inductor L81, an inductor L82, a capacitor C82, and a resistor R82. Inductor L81 is magnetically coupled to inductor L80. Inductor L82, capacitor C82, and resistor R82 are connected in series in this order between opposing ends of inductor L81. An inductance of inductor L82, a capacitance of capacitor C82, and a resistance value of resistor R82 are inertia M1, a reciprocal of distortion k1, and viscosity η1 of acoustic wave resonator 800 in FIG. 3, respectively.

As voltage V1 is applied to electric circuit 811 by AC power supply 900, current Iw is input to acoustic wave resonator 800. A current Ie flows through capacitor C0 and a current Iac flows through inductor L80. Current Iw is the sum of current Ie and current Iac.

As current Iac flows through inductor L80, an electric signal is transmitted from electric circuit 811 to mechanical circuit 812 through magnetic coupling between inductors L80 and L81. The electric signal is converted to mechanical vibration and piezoelectric body 803 in FIG. 3 is excited. Force F1 generated in acoustic wave resonator 800 and a velocity v1 of excitation can be considered as a voltage F1 and a current v1 generated in inductor L81 in mechanical circuit 812.

In contrast, when piezoelectric body 803 is excited and voltage F1 is generated in inductor L81, mechanical vibration is transmitted from mechanical circuit 812 to electric circuit 811 through magnetic coupling between inductors L80 and L81. Mechanical vibration is converted to an electric signal and voltage V1 is generated in inductor L80 of electric circuit 811. In mechanical circuit 812, force F1 is expressed with velocity v1, inertia M1, distortion k1, and viscosity η1 as in an expression (1) below.

$$F_1 = M_1 \frac{dv_1}{dt} + k_1 \int v_1 dt + \eta_1 v_1 \quad (1)$$

Figure 5:
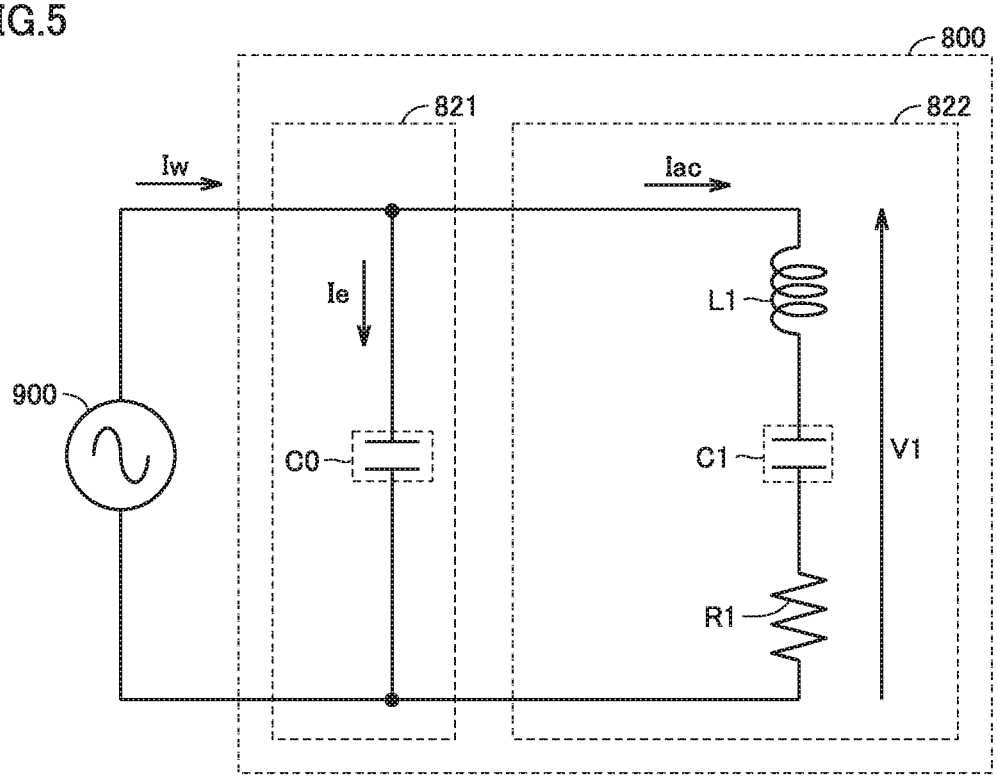
FIG. 5 is an electrical equivalent circuit diagram of a BVD model corresponding to the acoustic wave resonator in FIG. 3.

FIG. 5 is an electrical equivalent circuit diagram of a Butterworth-Van Dyke (BVD) model corresponding to acoustic wave resonator 800 in FIG. 3. Capacitor C0, voltage V1, current Iw, current Ie, and current Iac in FIG. 5 correspond to capacitor C0, voltage V1, current Iw, current Ie, and current Iac in FIG. 4, respectively. As shown in FIG. 5, acoustic wave resonator 800 includes an electrical path 821 and an acoustic path 822. Electrical path 821 and acoustic path 822 are connected in parallel between the opposing ends of AC power supply 900.

Electrical path 821 includes capacitor C0 connected between the opposing ends of AC power supply 900. A damping capacitance of acoustic wave resonator 800 means a capacitance of capacitor C0 in electrical path 821. Current Ie flows through electrical path 821.

Acoustic path 822 includes an inductor L1, a capacitor C1, and a resistor R1. Inductor L1, capacitor C1, and resistor R1 are connected in series in this order between the opposing ends of AC power supply 900. Current Iac flows through acoustic path 822.

Voltage V1 is expressed with current Iac, an inductance of inductor L1, a capacitance of capacitor C1, and a resistance value of resistor R1 as in an expression (2) below.

$$V_1 = L_1 \frac{dI_{ac}}{dt} + \frac{1}{C_1} \int I_{ac} dt + R_1 I_{ac} \quad (2)$$

Regarding the expressions (1) and (2), when force F1 and velocity v1 in the expression (1) are brought in correspondence with voltage V1 and current Iac in the expression (2), the expressions (1) and (2) can be considered as expressions that express the same vibration phenomenon. Magnitude of excitation of piezoelectric body 803 in FIG. 3 is reflected on magnitude of voltage V1 generated in acoustic path 822 in FIG. 5 and magnitude of current Iac that flows through acoustic path 822.

Distortion caused by non-linearity of the elastic constant of acoustic wave resonator 800 has been known to be in proportion to magnitude of excitation per unit area of the acoustic wave resonator. Magnitude of excitation per unit area of the acoustic wave resonator correlates with magnitude of a current per unit area of acoustic path 822. Therefore, distortion caused by non-linearity of the elastic constant of acoustic wave resonator 800 is in proportion to magnitude of a current per unit area of acoustic path 822. An area of acoustic wave resonator 800 is in proportion to a capacitance (a damping capacitance) of capacitor C0. Therefore, distortion caused by the non-linearity of the elastic constant of acoustic wave resonator 800 can be compared based on comparison of a current density Jac defined as in an expression (3) below.

$$J_{ac} = \frac{I_{ac}}{C_0} \quad (3)$$

As current density Jac expressed in the expression (3) is lower, distortion caused by the non-linearity of the elastic constant of acoustic wave resonator 800 is smaller. Consequently, IMD resulting from the non-linearity can also be suppressed.

Referring again to FIG. 2, when a transmission signal is input to terminal T12 in multiplexer 1, a current corresponding to the transmission signal from transmission filter 102 is input to transmission filter 101 and divided into currents to parallel arm resonator p4 and serial arm resonator s3. Since a current density in parallel arm resonator p4 and serial arm resonator s3 can be lowered, distortion caused by the non-linearity of the elastic constant in each resonator can be lessened and occurrence of IMD can be suppressed.

Distortion caused by non-linearity of the elastic constant tends to be large as a resonator is closer to the common terminal. Therefore, in multiplexer 1, a damping capacitance of parallel arm resonator p4 is set to be higher than a minimum value of a damping capacitance of each of serial arm resonators s1 to s4. Since a current density in parallel arm resonator p4 is lower than in an example where the damping capacitance of parallel arm resonator p4 is lower than the minimum value of the damping capacitance of each of serial arm resonators s1 to s4, occurrence of IMD can be suppressed. Consequently, deterioration of reception sensitivity of multiplexer 1 can be suppressed.

Figure 6:
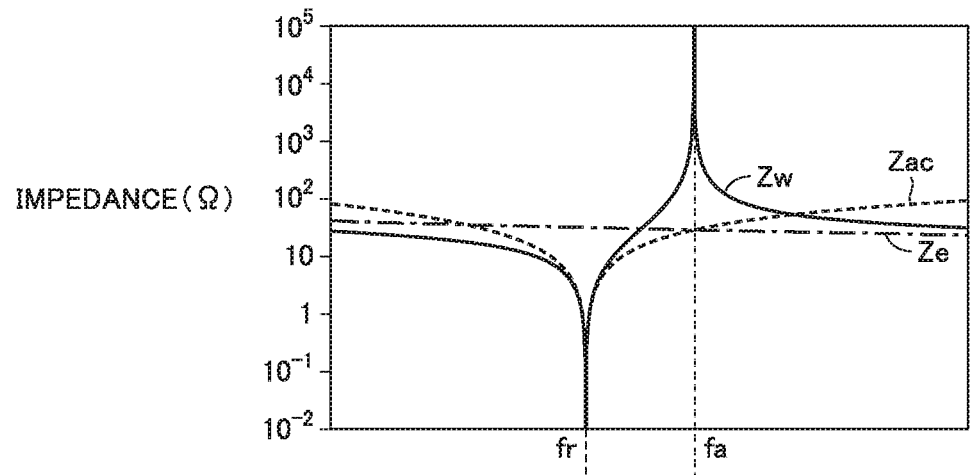
FIG. 6 is a diagram showing a frequency characteristic of an impedance of the acoustic wave resonator in FIG. 5 and also a frequency characteristic of a current that flows through the acoustic wave resonator.
Figure 6:
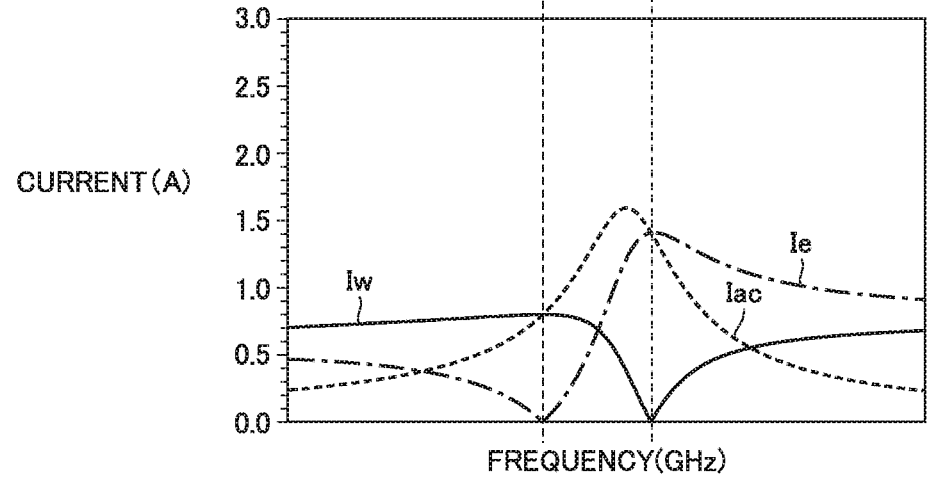

FIG. 6 is a diagram showing a frequency characteristic of an impedance of acoustic wave resonator 800 in FIG. 5 and also a frequency characteristic of a current that flows through the acoustic wave resonator. In FIG. 6, frequencies fr and fa represent a resonance frequency and an antiresonance frequency of the acoustic wave resonator. An impedance of the acoustic wave resonator attains to a relative minimum at resonance frequency fr and to a relative maximum at antiresonance frequency fa. As the frequency is higher than antiresonance frequency fa, the impedance of the acoustic wave resonator moves clockwise on the Smith chart and becomes a capacitive impedance.

FIG. 6 (*a*) shows an impedance Zw of the acoustic wave resonator, a frequency characteristic of an impedance Ze of the electrical path, and also a frequency characteristic of an impedance Zac of the acoustic path. FIG. 6 (*b*) shows a frequency characteristic of current Iw that passes through the acoustic wave resonator, a frequency characteristic of current Ie that flows through the electrical path, and also a frequency characteristic of current Iac that flows through the acoustic path.

As shown in FIG. 6 (*a*), impedance Zw of the acoustic wave resonator and impedance Zac of the acoustic path attain to substantially 0 at resonance frequency fr. Resonance frequency fr is expressed with inductor L1 and capacitor C1 included in the acoustic path as in an expression (4) below.

$$f_r = \frac{1}{2\pi\sqrt{L_1 C_1}} \quad (4)$$

As shown in FIG. 6 (*b*), substantially no current flows through the electrical path at resonance frequency fr. Current Iac that flows through the acoustic path at resonance frequency fr is substantially the same as current Iw that passes through the acoustic wave resonator.

As shown in FIG. 6 (*a*), the impedance of the acoustic wave resonator becomes very high at antiresonance frequency fa. At antiresonance frequency fa higher than resonance frequency fr, impedance Zac is inductive. Therefore, an impedance element included in the acoustic path can be approximated to a single inductor Lac. Antiresonance frequency fa is expressed as a resonance frequency of an LC parallel resonance circuit formed from inductor Lac and capacitor C0 in the electrical path as in an expression (5) below.

$$f_a = \frac{1}{2\pi\sqrt{L_{ac} C_0}} \quad (5)$$

As shown in FIG. 6 (*b*), current Iw that passes through the acoustic wave resonator attains to the relative minimum at antiresonance frequency fa. A current substantially the same in magnitude flows through the electrical path and the acoustic path. This is because a current circulates through a circulation signal path formed by the acoustic path and the electrical in the acoustic wave resonator. In this case, the current in the electrical path and the current in the acoustic path are opposite in phase to each other. Though substantially no current passes through acoustic wave resonator at antiresonance frequency fa, a relatively high current flows in the inside of the acoustic wave resonator.

A phase of current Iac that flows through the acoustic path at antiresonance frequency fa is the same as the inverted phase of current Ie that flows through the electrical path. Currents Iac_fa and Ie_fa are expressed with a current Iw_fa that passes through the acoustic wave resonator at antiresonance frequency fa, Qa which is a Q factor of the acoustic wave resonator at antiresonance frequency fa, and an imaginary unit j, as in expressions (6) and (7) below, respectively.

$$I_{ac\_fa} = -j \cdot Q_a \cdot I_{w\_fa} \quad (6)$$

$$I_{e\_fa} = j \cdot Q_a \cdot I_{w\_fa} \quad (7)$$

Current Iac_fa that flows through the acoustic path at antiresonance frequency fa is Qa times as high as a reference current Iw_fa which is a current that passes through the acoustic wave resonator. Therefore, in order to lessen distortion caused by non-linearity of the elastic constant of the acoustic wave resonator, reference current Iw_fa should be lowered.

Figure 7:
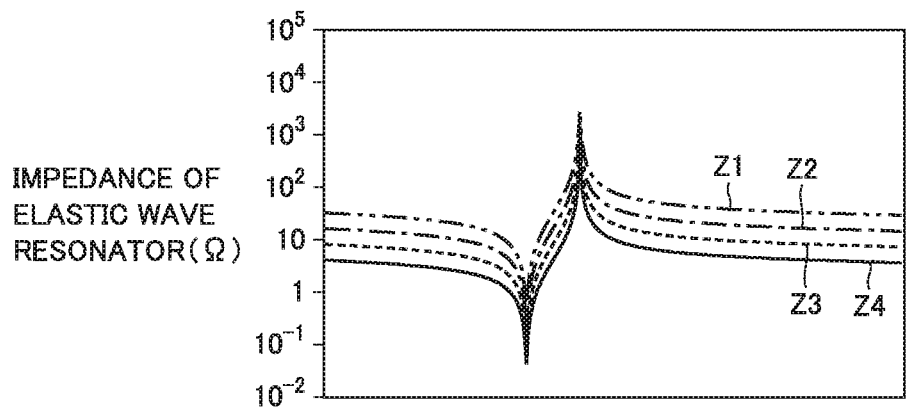
FIG. 7 is a diagram showing variation in frequency characteristic of an impedance, variation in frequency characteristic of a current through an acoustic path, and also variation in frequency characteristic of a current density in the acoustic path when a damping capacitance of an acoustic wave resonator is varied with a fractional bandwidth of the acoustic wave resonator being constant.
Figure 7:
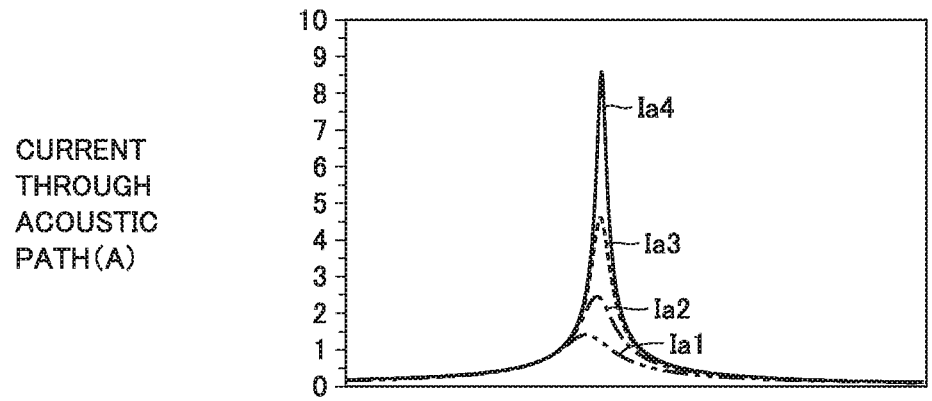
Figure 7:
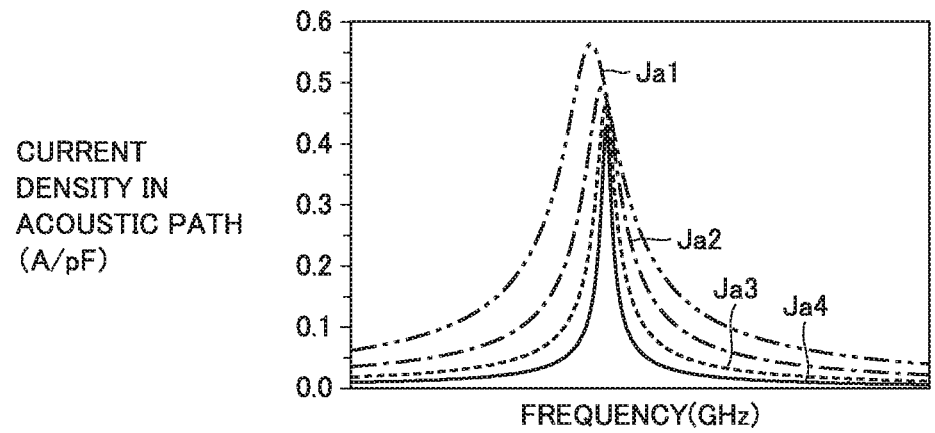

FIG. 7 is a diagram showing variation in frequency characteristic of an impedance of the acoustic wave generator, variation in frequency characteristic of a current through the acoustic path, and also variation in frequency characteristic of a current density in the acoustic path when a damping capacitance of the acoustic wave resonator is varied with a fractional bandwidth of the acoustic wave resonator being constant. The fractional bandwidth of the acoustic wave resonator refers to a ratio of a difference between an antiresonance frequency and a resonance frequency to the resonance frequency.

FIG. 7 (*a*) is a diagram showing variation in frequency characteristic of an impedance of the acoustic wave resonator when a damping capacitance of the acoustic wave resonator is varied with a fractional bandwidth of the acoustic wave resonator being constant. In FIG. 7 (a), the damping capacitance of the acoustic wave resonator is higher in the ascending order of curves Z1 to Z4. As shown in FIG. 7 (a), as the damping capacitance of the acoustic wave resonator is higher, the impedance of the acoustic wave resonator is lower.

FIG. 7 (b) is a diagram showing variation in frequency characteristic of a current through the acoustic path when a damping capacitance of the acoustic wave resonator is varied with a fractional bandwidth of the acoustic wave resonator being constant. In FIG. 7 (b), curves Ia1 to Ia4 correspond to curves Z1 to Z4 in FIG. 7 (a), respectively. As shown in FIG. 7 (b), as the damping capacitance of the acoustic wave resonator is higher, the current that flows through the acoustic path is higher.

FIG. 7 (c) is a diagram showing variation in frequency characteristic of a current density in the acoustic path of the acoustic wave resonator when a damping capacitance of the acoustic wave resonator is varied with a fractional bandwidth of the acoustic wave resonator being constant. In FIG. 7 (c), curves Ja1 to Ja4 correspond to curves Z1 to Z4 in FIG. 7 (a), respectively. As shown in FIG. 7 (c), as the damping capacitance of the acoustic wave resonator is higher, the current density in the acoustic path is lower.

In multiplexer 1, a current input to transmission filter 101 is divided into currents to parallel arm resonator p4 and serial arm resonator s3, so that a current that passes through parallel arm resonator p4 can be lowered. By setting the damping capacitance of parallel arm resonator p4 to be higher than the minimum value of the damping capacitance of each of serial arm resonators s1 to s3 in multiplexer 1, the current density in parallel arm resonator p4 can be lowered. According to multiplexer 1, deterioration of reception sensitivity can be suppressed.

Figure 8:
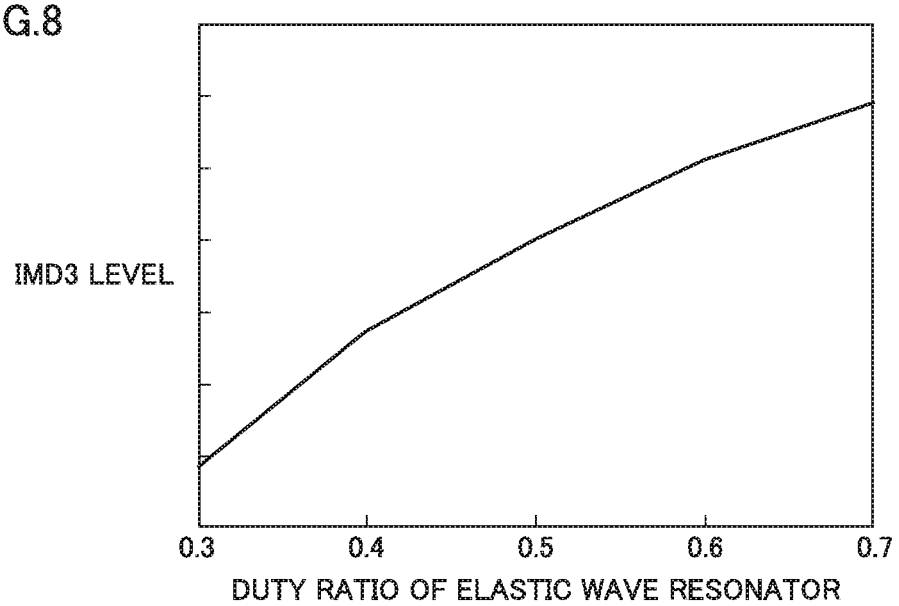
FIG. 8 is a diagram showing correspondence between a duty ratio of an acoustic wave resonator and an IMD3 level.

It has been known that, when each acoustic wave resonator included in the resonance circuit includes an IDT electrode, as a duty ratio of the acoustic wave resonator is higher, an IMD3 level of the resonance circuit is higher as shown in FIG. 8. The duty ratio of the acoustic wave resonator is an average value of duty ratios of a plurality of electrode fingers constituting the acoustic wave resonator. A duty ratio of the acoustic wave resonator including an interdigital transducer (IDT) electrode 830 as shown in FIG. 9 is a ratio of an electrode finger width WI to the sum of electrode finger width WI and a gap GI between electrode fingers.

Figure 9:
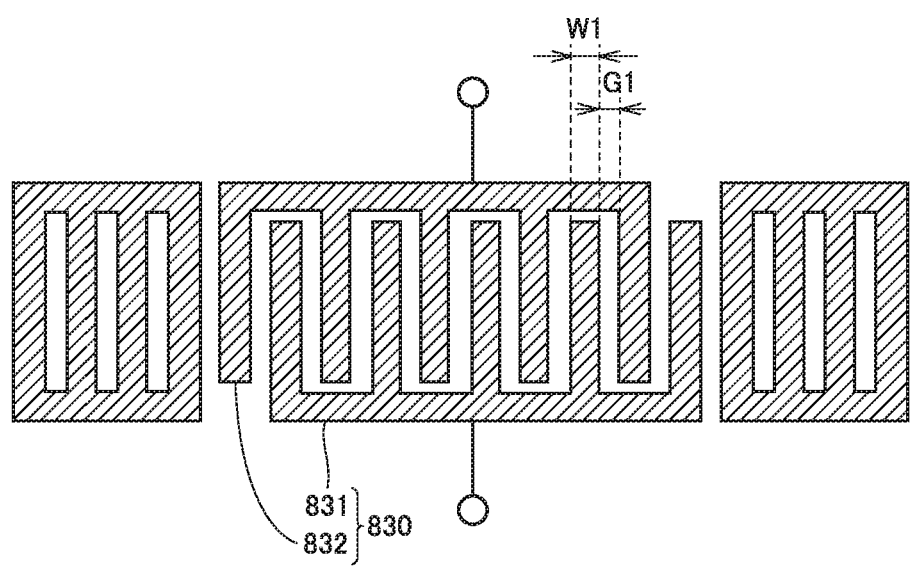
FIG. 9 is a plan view schematically showing a structure of an electrode of the acoustic wave resonator in FIG. 8.

When each of parallel arm resonator p4 and serial arm resonators s1 to s3 is formed as the acoustic wave resonator including IDT electrode 830 as shown in FIG. 9, a duty ratio of parallel arm resonator p4 is desirably lower than a maximum value of a duty ratio of each of serial arm resonators s1 to s3.

An example in which each of the first filter and the second filter is the transmission filter is described in the first embodiment. When two types of electric power different in frequency from each other are input from the common terminal, a problem the same as in the first embodiment occurs. Therefore, even though each of the first filter and the second filter is a reception filter, an effect the same as in the first embodiment is achieved.

First Modification of First Embodiment

In a first modification of the first embodiment, a configuration for further lowering a current density in parallel arm resonator p4 by connecting an impedance element in parallel to parallel arm resonator p4 between parallel arm resonator p4 and common terminal T10 is described.

Figure 10:
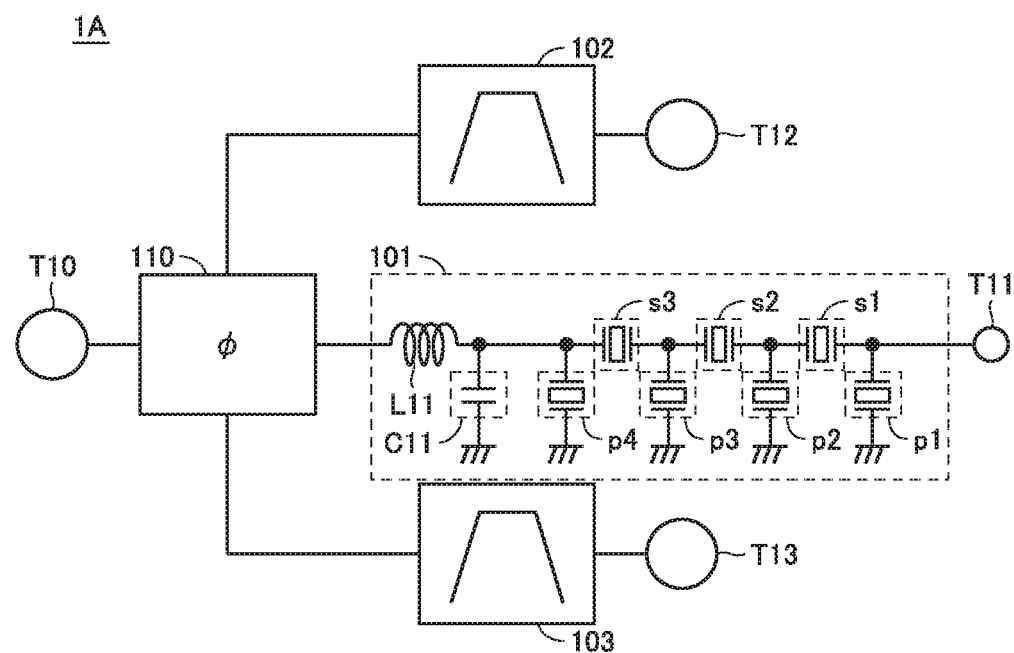
FIG. 10 is a circuit configuration diagram of a multiplexer according to a first modification of the first embodiment.

FIG. 10 is a circuit configuration diagram of a multiplexer 1A according to the first modification of the first embodiment. The configuration of multiplexer 1A is such that an inductor L11 and a capacitor C11 are added to transmission filter 101 in multiplexer 1 in FIG. 2. Since the configuration is otherwise the same, description will not be repeated.

As shown in FIG. 10, inductor L11 is connected between phase shifter 110 and a connection node between serial arm resonator s3 and parallel arm resonator p4. Capacitor C11 is connected between the grounding point and a connection node among inductor L11, serial arm resonator s3, and parallel arm resonator p4. Capacitor C11 is connected in parallel to parallel arm resonator p4.

When a transmission signal is input to terminal T12, a current corresponding to the transmission signal from transmission filter 102 is input to transmission filter 101. After the current passes through inductor L11, it is divided into currents to capacitor C11, parallel arm resonator p4, and serial arm resonator s3. Since the current is divided also into a current to capacitor C11, the current that passes through parallel arm resonator p4 and serial arm resonator s3 can further be lowered. Consequently, a current density in each of parallel arm resonator p4 and serial arm resonator s3 can further be lowered.

Inductor L11 and capacitor C11 may be included not in transmission filter 101 but in phase shifter 110. Capacitor C11 may be connected between the grounding point and a connection node between phase shifter 110 and inductor L11. An inductor may be connected as an impedance element in parallel to parallel arm resonator p4. An impedance element does not have to be connected between common terminal T10 and the connection node between serial arm resonator s3 and parallel arm resonator p4.

Second Modification of First Embodiment

In a second modification of the first embodiment, an example in which, by replacing parallel arm resonator p4 in FIG. 2 with a parallel arm resonance circuit corresponding to a configuration where parallel arm resonator p4 is divided in series, a current density in each parallel arm resonator included in the parallel arm resonance circuit is further lowered will be described.

Figure 11:
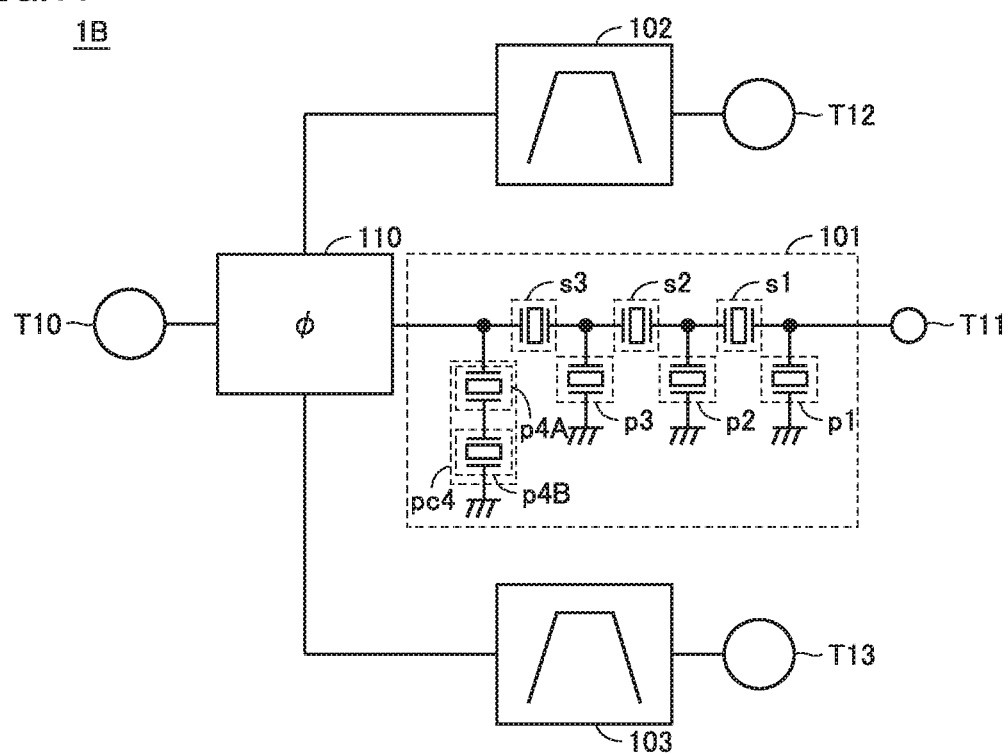
FIG. 11 is a circuit configuration diagram of a multiplexer according to a second modification of the first embodiment.

FIG. 11 is a circuit configuration diagram of a multiplexer 1B according to the second modification of the first embodiment. The configuration of multiplexer 1B is such that parallel arm resonator p4 in FIG. 2 is replaced with a parallel arm resonance circuit pc4. Since the configuration is otherwise the same, description will not be repeated.

As shown in FIG. 11, parallel arm resonance circuit pc4 includes parallel arm resonators p4A and p4B. Parallel arm resonators p4A and p4B are connected in series between a grounding point and the connection node between phase shifter 110 and serial arm resonator s3.

Figure 12:
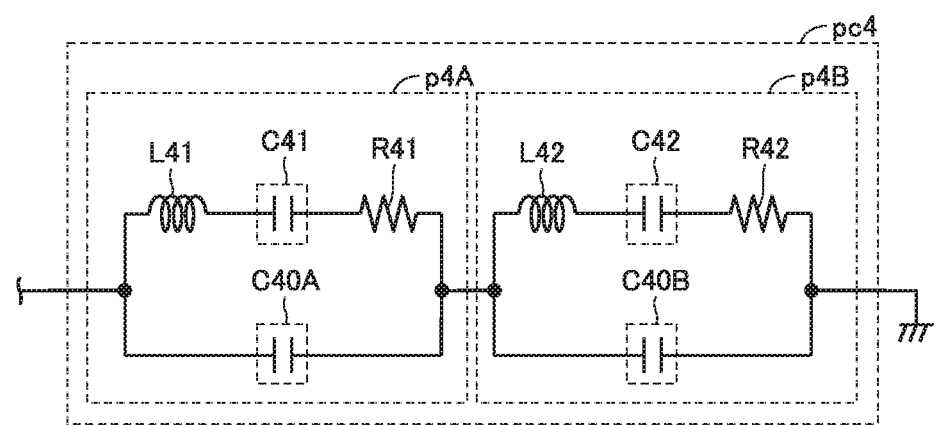
FIG. 12 is an electrical equivalent circuit diagram of a BVD model corresponding to a parallel arm resonance circuit in FIG. 11.

FIG. 12 is an electrical equivalent circuit diagram of a BVD model corresponding to parallel arm resonance circuit pc4 in FIG. 11. As shown in FIG. 12, parallel arm resonator p4A includes an inductor L41, a capacitor C41, a resistor R41, and a capacitor C40A. Inductor L41, capacitor C41, and resistor R41 are connected in series in this order between opposing terminals of capacitor C40A. A damping capacitance of parallel arm resonator p4A is a capacitance of capacitor C40A.

Parallel arm resonator p4B includes an inductor L42, a capacitor C42, a resistor R42, and a capacitor C40B. Inductor L42, capacitor C42, and resistor R42 are connected in series in this order between opposing terminals of capacitor C40B. A damping capacitance of parallel arm resonator p4B is a capacitance of capacitor C40B.

Parallel arm resonator p4A is equal in damping capacitance to parallel arm resonator p4B. A combined capacitance of parallel arm resonance circuit pc4 is a combined capacitance of the damping capacitance of parallel arm resonator p4A and the damping capacitance of parallel arm resonator p4B. When the damping capacitance of parallel arm resonance circuit pc4 is equal to the damping capacitance of parallel arm resonator p4 in FIG. 2, the damping capacitance of each of parallel arm resonators p4A and p4B is twice as high as the damping capacitance of parallel arm resonator p4 because capacitor C40A and capacitor C40B are connected in series. Consequently, the current density in each of parallel arm resonators p4A and p4B can be lower than the current density in parallel arm resonator p4 in FIG. 2. A duty ratio of parallel arm resonance circuit pc4 (an average value of duty ratios of parallel arm resonators p4A and p4B) is desirably lower than a maximum value of a duty ratio of each of serial arm resonators s1 to s3.

According to the multiplexer in the first embodiment and the first and second modifications above, deterioration of reception sensitivity can be suppressed.

Second Embodiment

The multiplexer including two transmission filters and a single reception filter is described in the first embodiment. In a second embodiment, a multiplexer including two transmission filters and two reception filters is described.

Figure 13:
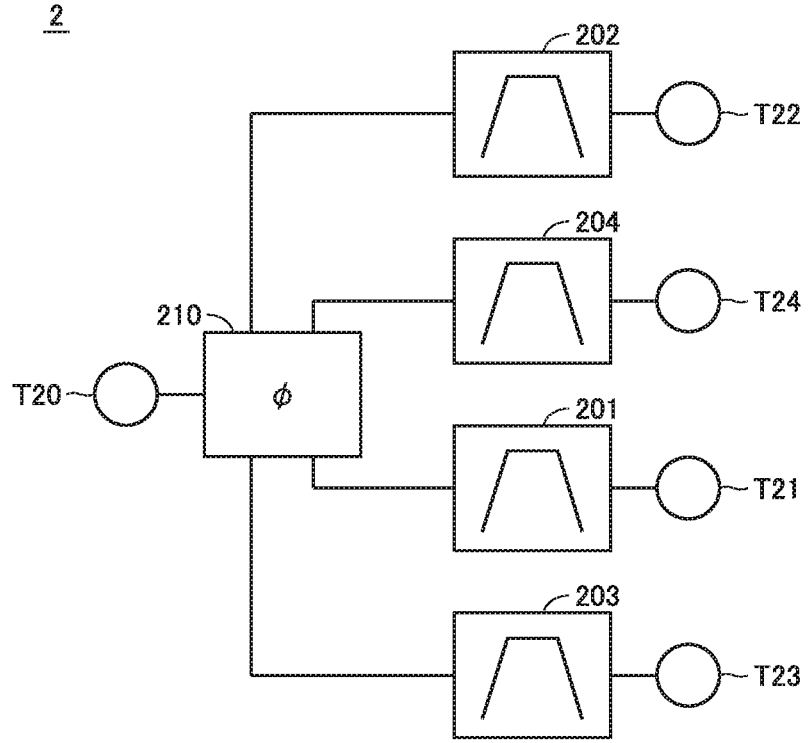
FIG. 13 is a circuit configuration diagram of a multiplexer according to a second embodiment.

FIG. 13 is a circuit configuration diagram of a multiplexer 2 according to the second embodiment. As shown in FIG. 13, a multiplexer 2 includes a common terminal T20 (a common terminal), a terminal T21 (a first terminal), a terminal T22 (a second terminal), a terminal T23 (a third terminal), a terminal T24 (a fourth terminal), a transmission filter 201 (a first filter), a transmission filter 202 (a second filter), a reception filter 203 (a third filter), a reception filter 204 (a fourth filter), and a phase shifter 210.

Common terminal T20 is connected to phase shifter 210. Transmission filter 201 is connected to phase shifter 210 and terminal T21, between common terminal T20 and terminal T21. Transmission filter 202 is connected to phase shifter 210 and terminal T22, between common terminal T20 and terminal T22. Reception filter 203 is connected to phase shifter 210 and terminal T23, between common terminal T20 and terminal T23. Reception filter 204 is connected to phase shifter 210 and terminal T24, between common terminal T20 and terminal T24. Phase shifter 210 may be provided as necessary and it is not an essential feature.

A passband B1 (a first passband) of transmission filter 201 is from 1920 to 1980 GHz. A passband B2 (a second passband) of transmission filter 202 is from 1710 to 1785 GHz. A passband B3 (a third passband) of reception filter 203 is from 2110 to 2170 GHz. A passband B4 (a fourth passband) of reception filter 204 is from 1805 to 1880 GHz. Passbands B1 to B4 correspond to Band1Tx, Band3Tx, Band1Rx, and Band3Rx defined under the third generation partnership project (3GPP), respectively.

Multiplexer 2 can simultaneously transmit from common terminal T20, a signal in passband B1 input from terminal T21 and a signal in passband B2 input from terminal T22. In other words, multiplexer 2 is adapted to 2ULCA.

With frequency f3 being defined as 2×f1−f2 with frequency f1 included in passband B1 and frequency f2 included in passband B2, a range of frequency f3 is from 2130 to 2175 GHz. A part of the range of frequency f3 overlaps passband B3 of reception filter 203. The range of frequency f3 is a frequency band where IMD3 due to a signal from transmission filter 201 and a signal from transmission filter 202 occurs. In multiplexer 2, IMD3 due to two transmission signals occurs in passband B3.

A lower limit frequency in the range of frequency f3 is a frequency calculated by subtracting 1710 GHz representing a lower limit frequency in passband B2 from twice 1920 GHz representing a lower limit frequency in passband B1. An upper limit frequency in the range of frequency f3 is a frequency calculated by subtracting 1785 GHz representing an upper limit frequency in passband B2 from twice 1980 GHz representing an upper limit frequency in passband B1.

Figure 14:
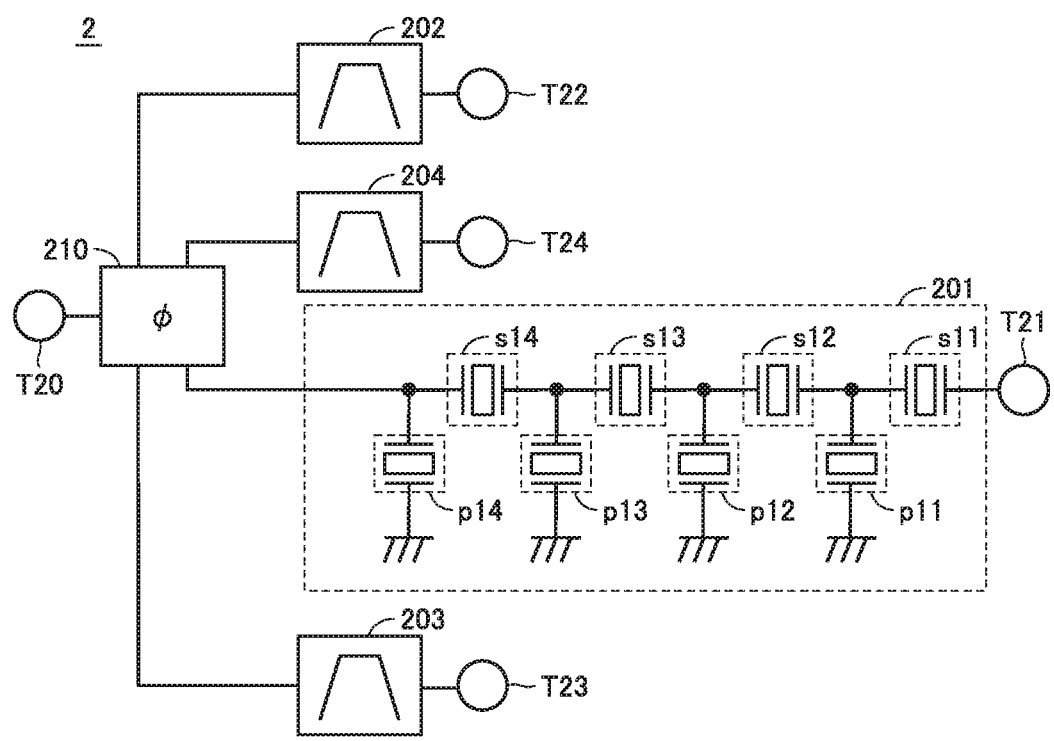
FIG. 14 is a diagram showing a specific circuit configuration of a transmission filter in FIG. 13.

FIG. 14 is a diagram showing a specific circuit configuration of transmission filter 201 in FIG. 13. As shown in FIG. 14, transmission filter 201 includes serial arm resonators s11 to s14 (a first serial arm resonance circuit), parallel arm resonators p11 to p13, and a parallel arm resonator p14 (a first parallel arm resonance circuit). Transmission filter 201 is an acoustic wave filter formed from an acoustic wave resonator.

Serial arm resonators s11 to s14 are connected in series in this order, between terminal T21 and phase shifter 210. Parallel arm resonator p11 is connected between a grounding point and a connection node between serial arm resonators s11 and s12. Parallel arm resonator p12 is connected between the grounding point and a connection node between serial arm resonators s12 and s13. Parallel arm resonator p13 is connected between the grounding point and a connection node between serial arm resonators s13 and s14. Parallel arm resonator p14 is connected between the grounding point and a connection node between serial arm resonator s14 and phase shifter 210. No acoustic wave resonator is connected between common terminal T20 and parallel arm resonator p14. Transmission filter 201 may further include an impedance element (a first impedance element) connected in parallel to parallel arm resonator p14, between the grounding point and common terminal T20.

A transmission signal in passband B1 input from terminal T21 passes through transmission filter 201 and is reflected by transmission filter 202, reception filter 203, and reception filter 204 and output from common terminal T20.

A transmission signal in passband B2 input from terminal T22 passes through transmission filter 202 and is reflected by transmission filter 201, reception filter 203, and reception filter 204 and output from common terminal T20. Specifically, a current corresponding to the transmission signal from transmission filter 202 is input to transmission filter 201 and divided into currents to parallel arm resonator p14 and serial arm resonator s14. The transmission signal in passband B2 is mainly reflected by parallel arm resonator p14 and serial arm resonator s14 and output from common terminal T20.

Parallel arm resonator p14 has a damping capacitance of 2.461 pF. Serial arm resonator s14 has a damping capacitance of 1.545 pF. Parallel arm resonator p14 is higher in damping capacitance than serial arm resonator s14.

Multiplexer 2 is compared with a multiplexer according to a first comparative example below. A configuration of the multiplexer according to the first comparative example is such that parallel arm resonator p14 has a damping capacitance of 1.644 pF and serial arm resonator s14 has a damping capacitance of 2.415 pF in the circuit configuration of multiplexer 2. In the multiplexer according to the first comparative example, parallel arm resonator p14 is lower in damping capacitance than serial arm resonator s14. Since the configuration is otherwise the same, description will not be repeated.

Table 1 below shows a maximum value of current Iac (mA) through the acoustic path in passbands B1 and B2, a maximum value of current density Jac (mA/pF) in the acoustic path, and a level DL3 ($A^2/pF^3$) of IMD3, of parallel arm resonator p14 and serial arm resonator s14 of multiplexer 2.

TABLE 1

| Acoustic wave Resonator | | p14 | s14 |
|---|---|---|---|
| Current Through Acoustic Path (Iac) | Maximum Value in Passband B2 | 149.5 | 37.1 |
| | Maximum Value in Passband B1 | 1217.0 | 731.8 |
| Current Density in Acoustic Path (Jac) | Maximum Value in Passband B2 | 60.7 | 24.0 |
| | Maximum Value in Passband B1 | 494.5 | 473.6 |
| IMD3 Level (DL3) | | 0.0366 | 0.0083 |

Table 2 below shows a maximum value of current Iac (mA) through the acoustic path in passbands B1 and B2, a maximum value of current density Jac (mA/pF) in the acoustic path, and level DL3 ($A^2/pF^3$) of IMD3, of parallel arm resonator p14 and serial arm resonator s14 of the multiplexer according to the first comparative example.

TABLE 2

| Acoustic wave Resonator | | p14 | s14 |
|---|---|---|---|
| Current Through Acoustic Path (Iac) | Maximum Value in Passband B2 | 130.6 | 105.7 |
| | Maximum Value in Passband B1 | 1476.8 | 1564.9 |
| Current Density in Acoustic Path (Jac) | Maximum Value in Passband B2 | 79.4 | 43.8 |
| | Maximum Value in Passband B1 | 898.3 | 648.0 |
| IMD3 Level (DL3) | | 0.1054 | 0.0444 |

Level DL3 of IMD3 in Tables 1 and 2 is expressed as in an expression (8) below. This is also applicable to Tables 3 to 5 which will be described later. C0 in the expression (8) represents a damping capacitance of the acoustic wave resonator. Max (Jac(f1)) represents a maximum value of current density Jac in passband B1. Max (Jac(f2)) represents a maximum value of current density Jac in passband B2.

$$DL_3 = \text{Max}(J_{ac}(f_1))^2 \times \text{Max}(J_{ac}(f_2)) \times C_0 \quad (8)$$

Based on comparison between Tables 1 and 2, multiplexer 2 is lower in IMD3 level of each of parallel arm resonator p14 and serial arm resonator s14 than the multiplexer according to the first comparative example. Multiplexer 2 can achieve suppressed IMD3 as compared with the multiplexer in the first comparative example.

Figure 15:
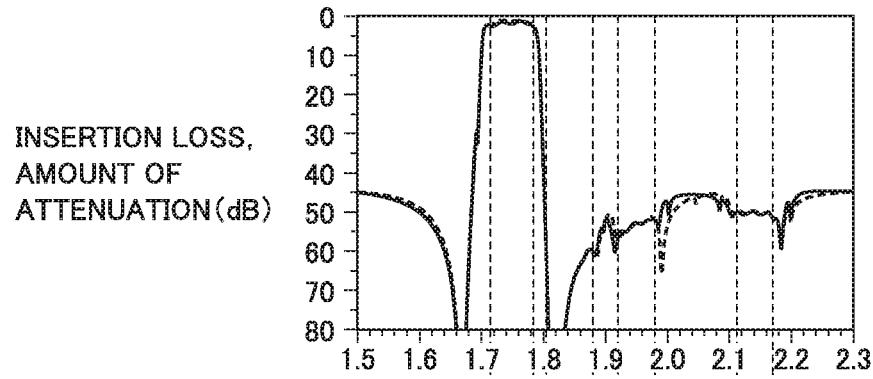
FIG. 15 is a diagram showing a pass characteristic of the multiplexer in FIG. 14 and also a pass characteristic of a multiplexer according to a first comparative example.
Figure 15:
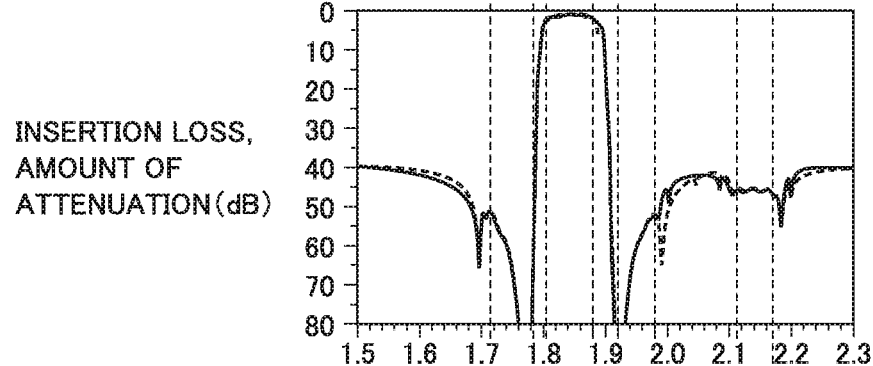
Figure 15:
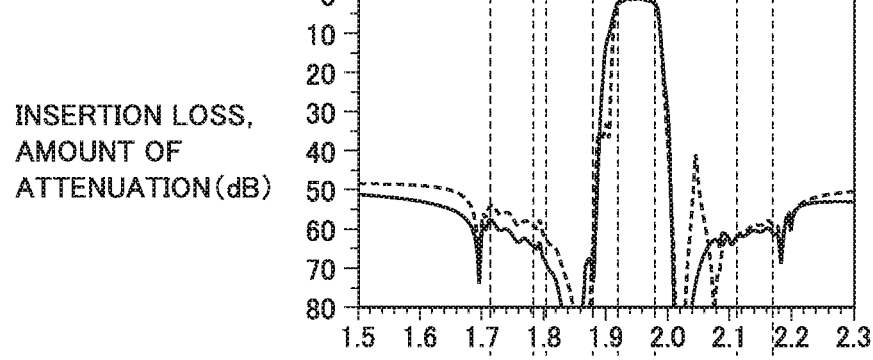
Figure 15:
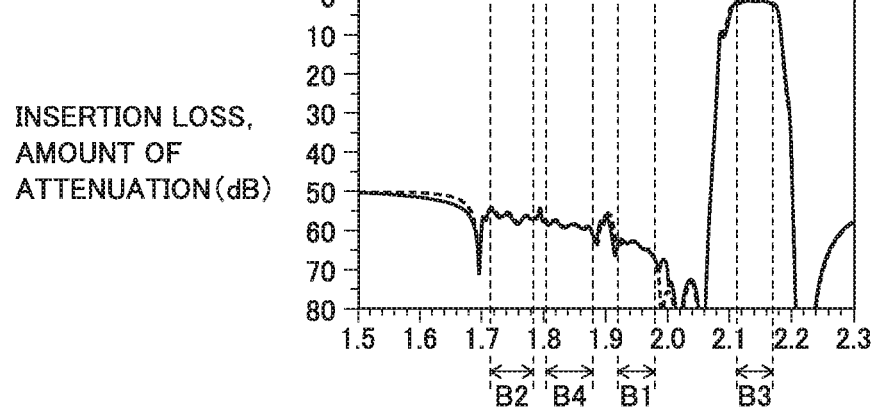

FIG. 15 is a diagram showing a pass characteristic (a frequency characteristic of insertion loss and an amount of attenuation) of multiplexer 2 in FIG. 14 and also a pass characteristic of a multiplexer according to the first comparative example. In FIG. 15, a solid line represents a pass characteristic of multiplexer 2 and a dotted line represents a pass characteristic of the multiplexer according to the first comparative example.

FIG. 15 (a) shows a pass characteristic from terminal T22 to common terminal T20. FIG. 15 (b) shows a pass characteristic from common terminal T20 to terminal T24. FIG. 15 (c) shows a pass characteristic from terminal T21 to common terminal T20. FIG. 15 (d) shows a pass characteristic from common terminal T20 to terminal T23.

As shown in FIG. 15, in each of passbands B1 to B4 of multiplexer 2, a pass characteristic comparable to the pass characteristic of the multiplexer according to the first comparative example is achieved. Multiplexer 2 can achieve suppressed IMD3 as compared with the multiplexer according to the first comparative example while it maintains the pass characteristic.

Modification of Second Embodiment

In the second embodiment, a multiplexer including four terminals corresponding to four respective filters is described. In a modification of the second embodiment, a multiplexer in which two terminals connected to two respective transmission filters are integrated into one transmission terminal and two terminals connected to two respective reception filters are integrated into one reception terminal is described.

Figure 16:
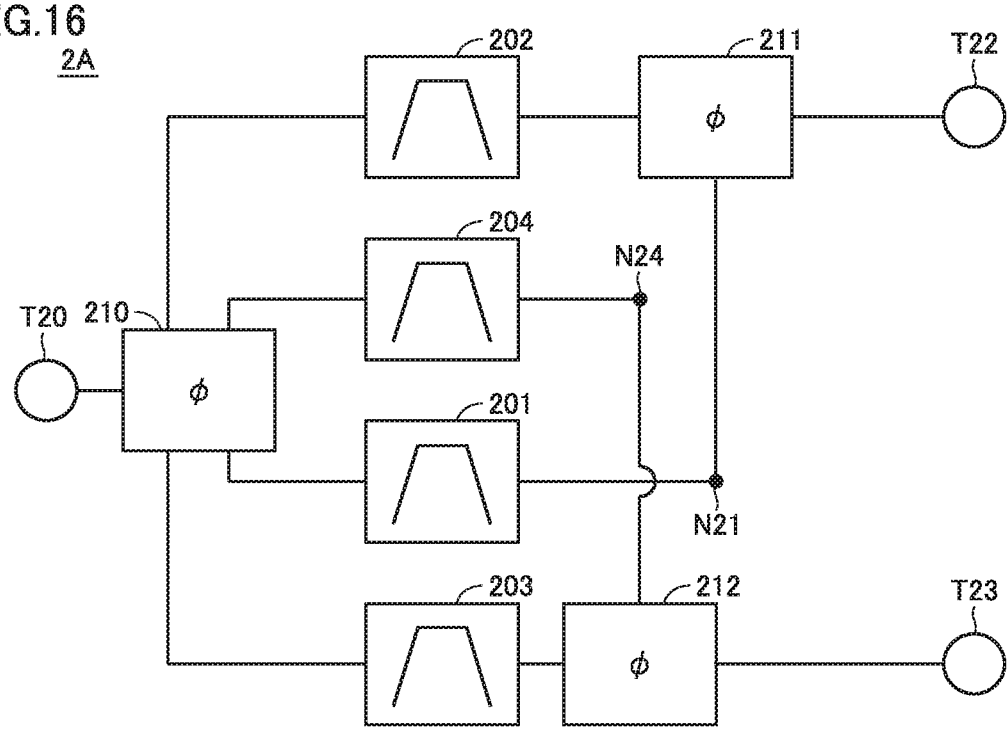
FIG. 16 is a circuit configuration diagram of a multiplexer according to a modification of the second embodiment.

FIG. 16 is a circuit configuration diagram of a multiplexer 2A according to the modification of the second embodiment. The configuration of multiplexer 2A is such that terminals T21 and T24 of multiplexer 2 in FIG. 13 are replaced with connection nodes N21 and N24, respectively, and phase shifters 211 and 212 are added. Since the configuration is otherwise the same, description will not be repeated.

As shown in FIG. 16, phase shifter 211 is connected between transmission filter 201 and terminal T22 and connected between transmission filter 202 and terminal T22. Phase shifter 212 is connected between reception filter 203 and terminal T23 and connected between reception filter 204 and terminal T23. Transmission filter 201 and phase shifter 211 are connected at connection node N21 (the first terminal). Reception filter 204 and phase shifter 212 are connected at connection node N24 (the fourth terminal). Phase shifters 211 and 212 may be provided as necessary and they are not essential features.

In multiplexer 2A, transmission terminals T21 and T22 of multiplexer 2 in FIG. 13 are integrated into terminal T22 in FIG. 16. Reception terminals T23 and T24 of multiplexer 2 in FIG. 13 are integrated into terminal T23 in FIG. 16. According to the multiplexer in the modification of the second embodiment, the number of terminals can be decreased and deterioration of reception sensitivity can be suppressed.

According to the multiplexer in the second embodiment and the modification above, deterioration of reception sensitivity can be suppressed.

Third Embodiment

An example in which one of two transmission filters is an acoustic wave filter is described in the second embodiment. In a third embodiment, an example in which each of the two transmission filters is an acoustic wave filter is described.

Figure 17:
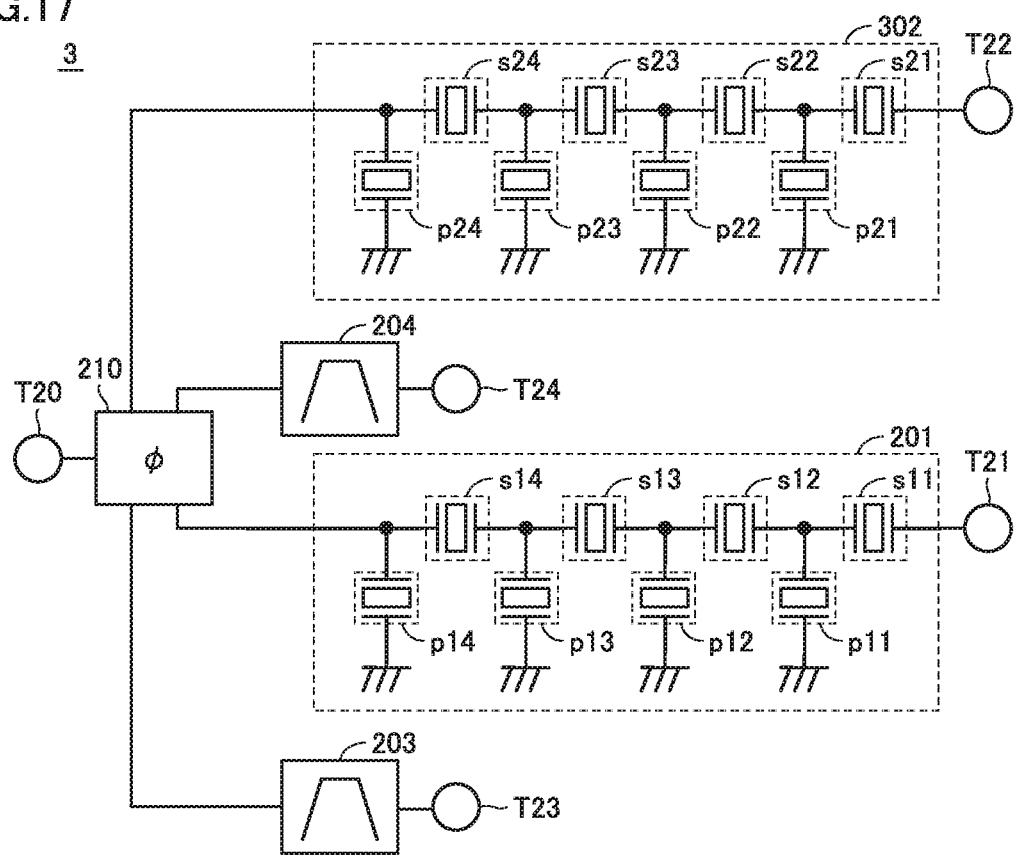
FIG. 17 is a circuit configuration diagram of a multiplexer according to a third embodiment.

FIG. 17 is a circuit configuration diagram of a multiplexer 3 according to the third embodiment. The configuration of multiplexer 3 is such that transmission filter 202 of multiplexer 2 in FIG. 14 is replaced with a transmission filter 302 (a second filter). Since the configuration is otherwise the same, description will not be repeated.

As shown in FIG. 17, transmission filter 302 includes serial arm resonators s21 to s24 (a second serial arm resonance circuit), parallel arm resonators p21 to p23, and a parallel arm resonator p24 (a second parallel arm resonance circuit). Transmission filter 302 is an acoustic wave filter formed from an acoustic wave resonator.

Serial arm resonators s21 to s24 are connected in series in this order between terminal T22 and phase shifter 210. Parallel arm resonator p21 is connected between a grounding point and a connection node between serial arm resonators s21 and s22. Parallel arm resonator p22 is connected between the grounding point and a connection node between serial arm resonators s22 and s23. Parallel arm resonator p23 is connected between the grounding point and a connection node between serial arm resonators s23 and s24. Parallel arm resonator p24 is connected between the grounding point and a connection node between serial arm resonator s24 and phase shifter 210. No acoustic wave resonator is connected between common terminal T20 and parallel arm resonator p24. Transmission filter 302 may further include an impedance element (a second impedance element) connected in parallel to parallel arm resonator p24, between the grounding point and common terminal T20.

A transmission signal in passband B1 input from terminal T21 passes through transmission filter 201 and is reflected by transmission filter 202, reception filter 203, and reception filter 204 and output from common terminal T20. Specifically, a current corresponding to the transmission signal from transmission filter 201 is input to transmission filter 202, and divided into currents to parallel arm resonator p24 and serial arm resonator s24. The transmission signal in passband B1 is mainly reflected by parallel arm resonator p24 and serial arm resonator s24 and output from common terminal T20. A process at the time when a transmission signal in passband B2 is input from terminal T22 is the same as in the second embodiment.

Parallel arm resonator p24 as a damping capacitance of 2.018 pF. Serial arm resonator s24 has a damping capacitance of 1.350 pF. Parallel arm resonator p24 is higher in damping capacitance than serial arm resonator s24.

Multiplexer 3 is compared with a multiplexer according to a second comparative example below. A configuration of the multiplexer according to the second comparative example is such that parallel arm resonator p24 has a damping capacitance of 1.518 pF and serial arm resonator s24 has a damping capacitance of 2.050 pF in the circuit configuration of multiplexer 3. In the multiplexer according to the second comparative example, parallel arm resonator p24 is lower in damping capacitance than serial arm resonator s24. Since the configuration is otherwise the same, description will not be repeated.

Table 3 below shows a maximum value of current Iac (mA) through the acoustic path in passbands B1 and B2, a maximum value of current density Jac (mA/pF) in the acoustic path, and level DL3 ($A^2/pF^3$) of IMD3, of parallel arm resonators p14 and p24 and serial arm resonators s14 and s24 of multiplexer 3.

TABLE 3

| Acoustic wave Resonator | | p14 | s14 |
|---|---|---|---|
| Current Through Acoustic Path (Iac) | Maximum Value in Passband B2 | 127.6 | 33.6 |
| | Maximum Value in Passband B1 | 1292.7 | 731.8 |
| Current Density in Acoustic Path (Jac) | Maximum Value in Passband B2 | 51.8 | 21.7 |
| | Maximum Value in Passband B1 | 525.3 | 473.7 |
| IMD3 Level (DL3) | | 0.0352 | 0.0075 |

TABLE 3-continued

| Acoustic wave Resonator | | p24 | s24 |
|---|---|---|---|
| Current Through Acoustic Path (Iac) | Maximum Value in Passband B2 | 786.4 | 879.6 |
| | Maximum Value in Passband B1 | 87.8 | 45.5 |
| Current Density in Acoustic Path (Jac) | Maximum Value in Passband B2 | 389.7 | 651.6 |
| | Maximum Value in Passband B1 | 43.5 | 33.7 |
| IMD3 Level (DL3) | | 0.0015 | 0.0010 |

Table 4 below shows a maximum value of current Iac (mA) through the acoustic path in passbands B1 and B2, a maximum value of current density Jac (mA/pF) in the acoustic path, and level DL3 ($A^2/pF^3$) of IMD3, of parallel arm resonators p14 and p24 and serial arm resonators s14 and s24 of the multiplexer according to the second comparative example.

TABLE 4

| Acoustic wave Resonator | | p14 | s14 |
|---|---|---|---|
| Current Through Acoustic Path (Iac) | Maximum Value in Passband B2 | 149.5 | 37.1 |
| | Maximum Value in Passband B1 | 1217.0 | 731.8 |
| Current Density in Acoustic Path (Jac) | Maximum Value in Passband B2 | 60.7 | 24.0 |
| | Maximum Value in Passband B1 | 494.5 | 473.7 |
| IMD3 Level (DL3) | | 0.0366 | 0.0083 |

| Acoustic wave Resonator | | p24 | s24 |
|---|---|---|---|
| Current Through Acoustic Path (Iac) | Maximum Value in Passband B2 | 1261.0 | 1172.4 |
| | Maximum Value in Passband B1 | 69.0 | 74.6 |
| Current Density in Acoustic Path (Jac) | Maximum Value in Passband B2 | 830.7 | 571.9 |
| | Maximum Value in Passband B1 | 45.5 | 36.4 |
| IMD3 Level (DL3) | | 0.0026 | 0.0016 |

Based on comparison between Tables 1 and 4, the multiplexer according to the second comparative example is equal in IMD3 level of each of parallel arm resonator p14 and serial arm resonator s14 to the multiplexer according to the second embodiment. Based on comparison between Tables 3 and 4, multiplexer 3 is lower in IMD3 level of each of parallel arm resonators p14 and p24 and serial arm resonators s14 and s24 than the multiplexer according to the second comparative example. Multiplexer 3 can achieve suppressed IMD3 as compared with the multiplexer according to the second comparative example and the multiplexer according to the second embodiment.

Figure 18:
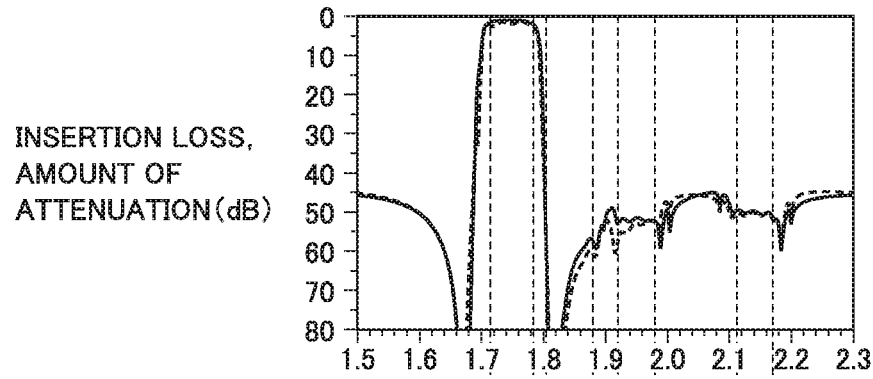
FIG. 18 is a diagram showing a pass characteristic of the multiplexer in FIG. 17 and also a pass characteristic of a multiplexer according to a second comparative example.
Figure 18:
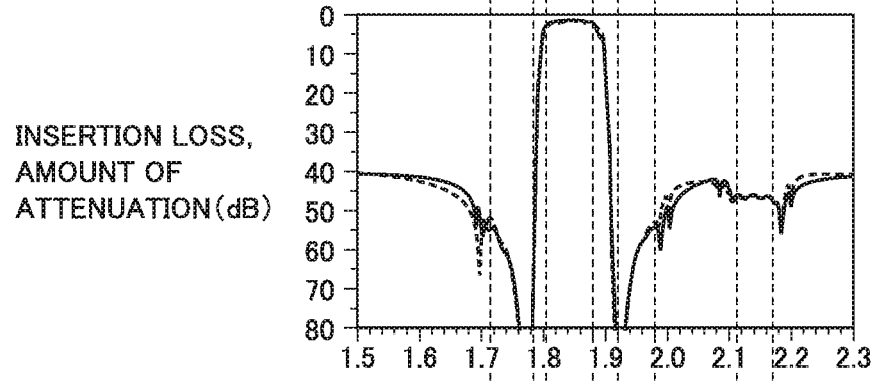
Figure 18:
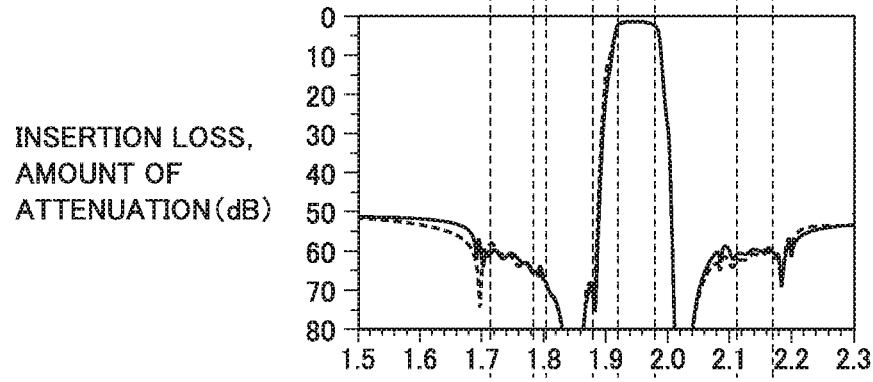
Figure 18:
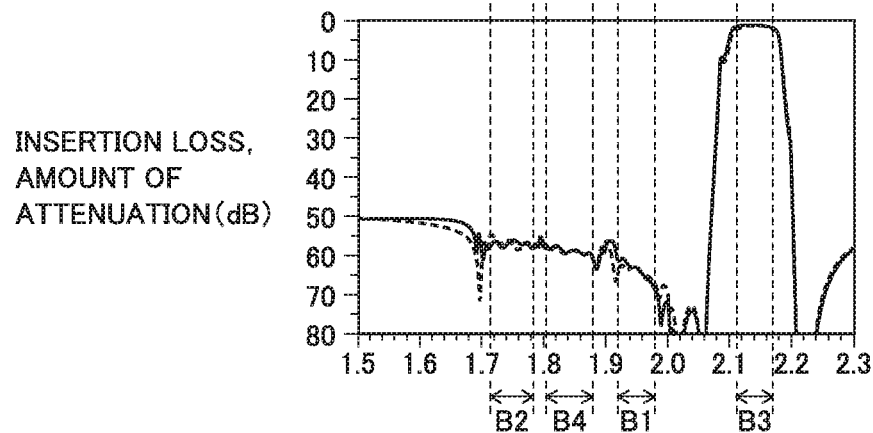

FIG. 18 is a diagram showing a pass characteristic of multiplexer 3 in FIG. 17 and also a pass characteristic of the multiplexer according to the second comparative example. In FIG. 18, a solid line shows a pass characteristic of multiplexer 3 and a dotted line shows a pass characteristic of the multiplexer according to the second comparative example.

FIG. 18 (a) shows a pass characteristic from terminal T22 to common terminal T20. FIG. 18 (b) shows a pass characteristic from common terminal T20 to terminal T24. FIG. 18 (c) shows a pass characteristic from terminal T21 to common terminal T20. FIG. 18 (d) shows a pass characteristic from common terminal T20 to terminal T23.

As shown in FIG. 18, in each of passbands B1 to B4 of multiplexer 3, a pass characteristic comparable to the pass characteristic of the multiplexer according to the second comparative example is achieved. Multiplexer 3 can achieve suppressed IMD3 as compared with the multiplexer according to the second comparative example and the multiplexer according to the second embodiment while it maintains the pass characteristic.

Modification of Third Embodiment

As shown in FIG. 18, passband B4 (1805 to 1880 GHz) of reception filter 204 is a frequency band between passband B1 (1920 to 1980 GHz) of transmission filter 201 and passband B2 (1710 to 1785 GHz) of transmission filter 202.

Normally, an antiresonance frequency of a serial arm resonator included in transmission filter 202 is higher than passband B2. An antiresonance frequency of a parallel arm resonator included in transmission filter 201 is often set around a lower limit of passband B1. Since each of an antiresonance frequency of a serial arm resonator included in transmission filter 202 and an antiresonance frequency of a parallel arm resonator included in transmission filter 201 is often close to passband B4, a current density in an acoustic wave resonator included in reception filter 204 tends to be high based on the expressions (3) and (6). Consequently, IMD3 due to two transmission signals generated in passband B4 tends to be great. Therefore, a reception filter having passband B4 is desirably configured to be able to suppress IMD, similarly to two transmission filters.

In a modification of the third embodiment, an example in which a reception filter having passband B4 is an acoustic wave filter configured to be able to suppress IMD similarly to two transmission filters is described. A multiplexer according to the modification of the third embodiment can achieve suppressed IMD in the reception filter having passband B4 and hence it can achieve suppressed deterioration of reception sensitivity as compared with the multiplexer in the third embodiment.

Figure 19:
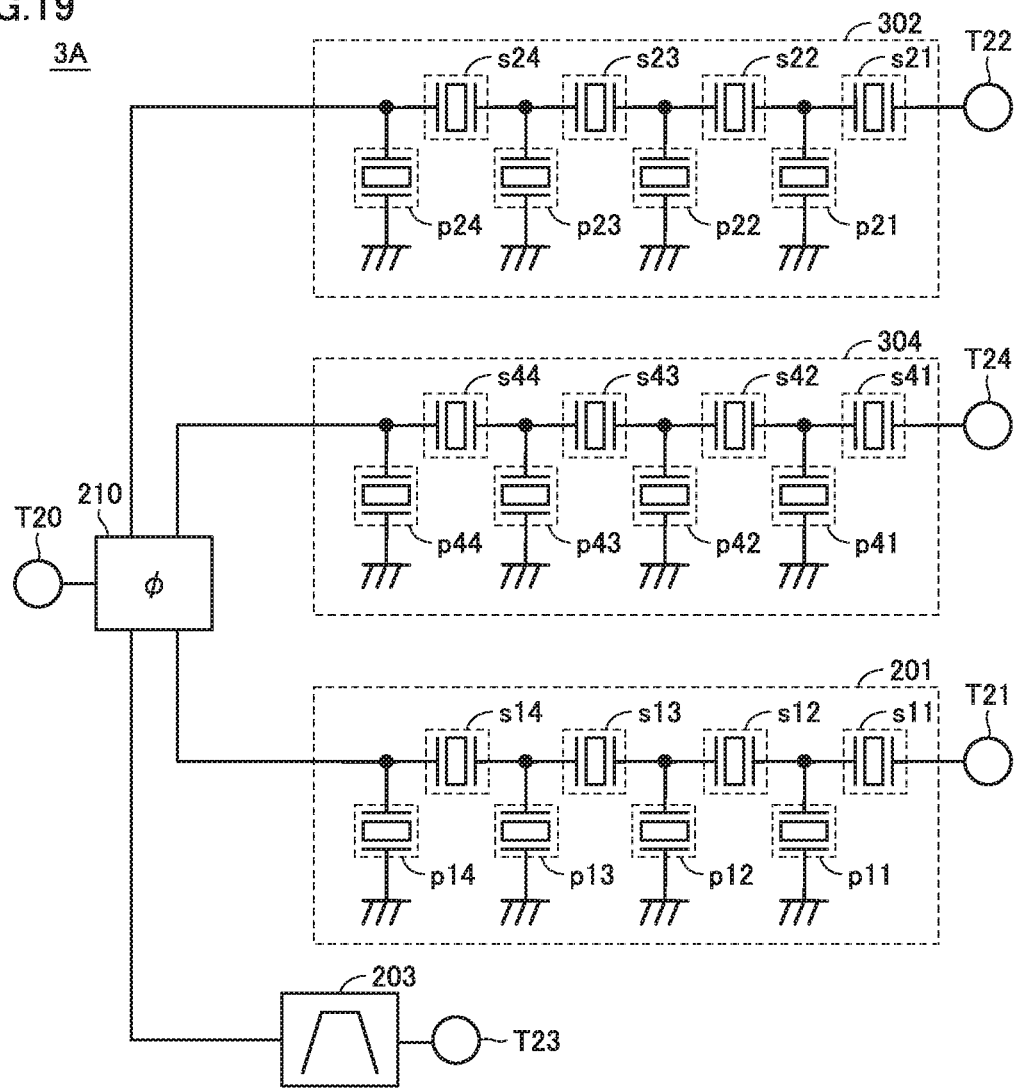
FIG. 19 is a circuit configuration diagram of a multiplexer according to a modification of the third embodiment.

FIG. 19 is a circuit configuration diagram of a multiplexer 3A according to the modification of the third embodiment. The configuration of multiplexer 3A is such that transmission filter 204 of multiplexer 3 in FIG. 17 is replaced with a reception filter 304 (a fourth filter). Since the configuration is otherwise the same, description will not be repeated.

As shown in FIG. 19, reception filter 304 includes serial arm resonators s41 to s44 (a third serial arm resonance circuit), parallel arm resonators p41 to p43, and a parallel arm resonator p44 (a third parallel arm resonance circuit). Reception filter 304 is an acoustic wave filter formed from an acoustic wave resonator.

Serial arm resonators s41 to s44 are connected in series in this order between terminal T24 and phase shifter 210. Parallel arm resonator p41 is connected between a grounding point and a connection node between serial arm resonators s41 and s42. Parallel arm resonator p42 is connected between the grounding point and a connection node between serial arm resonators s42 and s43. Parallel arm resonator p43 is connected between the grounding point and a connection node between serial arm resonators s43 and s44. Parallel arm resonator p44 is connected between the grounding point and a connection node between serial arm resonator s44 and phase shifter 210. No acoustic wave resonator is connected between common terminal T20 and parallel arm resonator p44. A parallel arm resonance circuit corresponding to such a configuration that parallel arm resonator p44 is divided in series may be provided instead of parallel arm resonator p44.

Reception filter 304 may further include an impedance element (a third impedance element) connected in parallel to parallel arm resonator p44, between the grounding point and common terminal T20. A damping capacitance of parallel arm resonator p44 is higher than a minimum value of a damping capacitance of each of serial arm resonators s41 to s44.

When a transmission signal in passband B1 is input to terminal T21 and a transmission signal in passband B2 is input to terminal T22, a current corresponding to the transmission signal from transmission filter 201 and a current corresponding to the transmission signal from transmission filter 202 are input to reception filter 304 and divided into currents to parallel arm resonator p44 and serial arm resonator s44. The transmission signal in passband B1 and the transmission signal in passband B2 are mainly reflected by parallel arm resonator p44 and serial arm resonator s44 and output from common terminal T20.

The multiplexer according to the third embodiment and the modification above can achieve suppressed deterioration of reception sensitivity as compared with the multiplexer according to the second embodiment.

Fourth Embodiment

In a fourth embodiment, an example in which each of two transmission filters includes a parallel arm resonance circuit corresponding to such a configuration that a single parallel arm resonator is divided in series is described.

Figure 20:
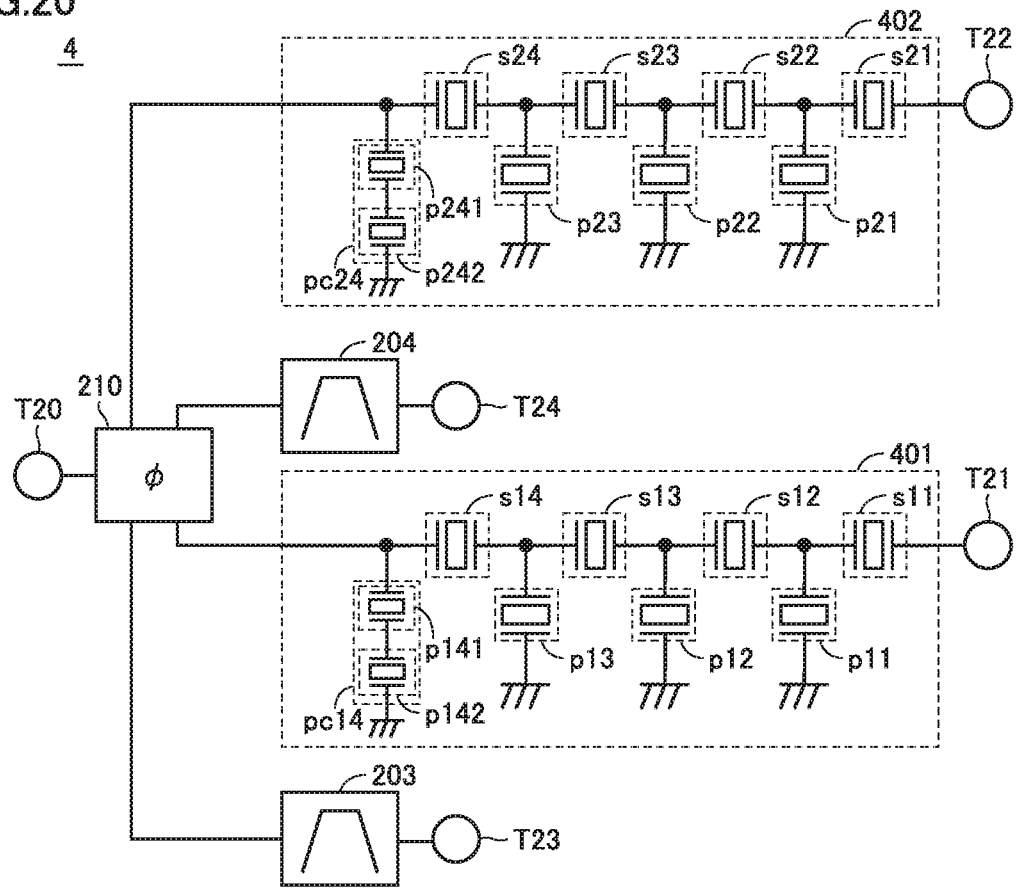
FIG. 20 is a circuit configuration diagram of a multiplexer according to a fourth embodiment.

FIG. 20 is a circuit configuration diagram of a multiplexer 4 according to the fourth embodiment. The configuration of multiplexer 4 is such that transmission filters 201 and 302 of multiplexer 3 in FIG. 17 are replaced with transmission filters 401 and 402, respectively. A configuration of transmission filter 401 is such that parallel arm resonator p14 of transmission filter 201 in FIG. 17 is replaced with parallel arm resonance circuit pc14. A configuration of transmission filter 402 is such that parallel arm resonator p24 of transmission filter 302 in FIG. 17 is replaced with a parallel arm resonance circuit pc24. Since the configuration is otherwise the same, description will not be repeated.

As shown in FIG. 20, parallel arm resonance circuit pc14 includes parallel arm resonators p141 and p142. Parallel arm resonators p141 and p142 are connected in series between a grounding point and phase shifter 210.

Parallel arm resonance circuit pc14 has a damping capacitance of 2.461 pF. Serial arm resonator s14 has a damping capacitance of 1.545 pF. Parallel arm resonance circuit pc14 is higher in damping capacitance than serial arm resonator s14. Each of parallel arm resonators p141 and p142 has a damping capacitance of 4.922 pF which is twice as high as the damping capacitance of parallel arm resonance circuit pc14.

Parallel arm resonance circuit pc24 includes parallel arm resonators p241 and p242. Parallel arm resonators p241 and p242 are connected in series between a grounding point and phase shifter 210.

Parallel arm resonance circuit pc24 has a damping capacitance of 2.018 pF. Serial arm resonator s24 has a damping capacitance of 1.350 pF. Parallel arm resonance circuit pc24 is higher in damping capacitance than serial arm resonator s24. Each of parallel arm resonators p241 and p242 has a damping capacitance of 4.036 pF which is twice as high as the damping capacitance of parallel arm resonance circuit pc24.

Table 5 below shows a maximum value of current Iac (mA) through the acoustic path in passbands B1 and B2, a maximum value of current density Jac (mA/pF) in the acoustic path, and level DL3 (A²/pF³) of IMD3, of parallel arm resonance circuits pc14 and pc24 and serial arm resonators s14 and s24 of multiplexer 4.

TABLE 5

| Acoustic wave Resonator | | pc14 | s14 |
|---|---|---|---|
| Current Through Acoustic Path (Iac) | Maximum Value in Passband B2 | 127.6 | 33.6 |
| | Maximum Value in Passband B1 | 1292.7 | 731.8 |
| Current Density in Acoustic Path (Jac) | Maximum Value in Passband B2 | 25.9 | 21.7 |
| | Maximum Value in Passband B1 | 262.6 | 473.7 |
| IMD3 Level (DL3) | | 0.0088 | 0.0075 |

| Acoustic wave Resonator | | pc24 | s24 |
|---|---|---|---|
| Current Through Acoustic Path (Iac) | Maximum Value in Passband B2 | 786.4 | 879.6 |
| | Maximum Value in Passband B1 | 87.8 | 45.5 |
| Current Density in Acoustic Path (Jac) | Maximum Value in Passband B2 | 194.8 | 651.6 |
| | Maximum Value in Passband B1 | 21.8 | 33.7 |
| IMD3 Level (DL3) | | 0.0004 | 0.0010 |

Based on comparison between Tables 3 and 5, the IMD3 levels of serial arm resonators s14 and s24 of multiplexer 4 are as high as the IMD3 levels of serial arm resonators s14 and s24 of multiplexer 3. The IMD3 levels of parallel arm resonance circuits pc14 and pc24 of multiplexer 4 are lower than the IMD3 levels of parallel arm resonators p14 and p24 of multiplexer 3. Multiplexer 4 can achieve suppressed IMD3 as compared with multiplexer 3.

The multiplexer according to the fourth embodiment above can achieve suppressed deterioration of reception sensitivity as compared with the multiplexer according to the third embodiment.

Fifth Embodiment

In a fifth embodiment, a radio-frequency front end circuit and a communication apparatus that can be implemented by using the multiplexers according to the first to fourth embodiments and the modifications are described.

Figure 21:
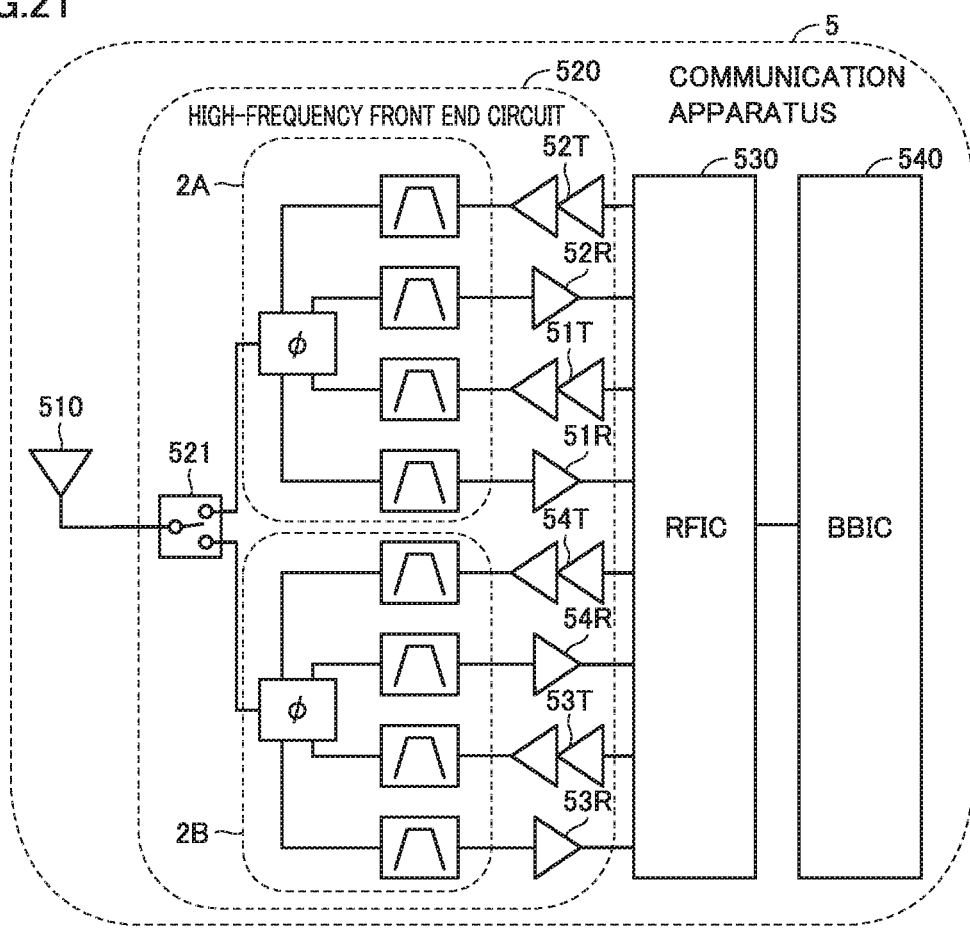
FIG. 21 is a configuration diagram of a communication apparatus according to a fifth embodiment.

FIG. 21 is a configuration diagram of a communication apparatus 5 according to the fifth embodiment. As shown in FIG. 21, communication apparatus 5 includes an antenna element 510, a radio-frequency front end circuit 520, a radio frequency (RF) signal processing circuit 530, and a baseband integrated circuit (BBIC) 540.

Radio-frequency front end circuit 520 includes a switch 521, multiplexers 2A and 2B according to the second embodiment, transmission amplification circuits 51T to 54T, and reception amplification circuits 51R to 54R. Radio-frequency front end circuit 520 may include the multiplexer according to the first, third, or fourth embodiment or the modifications.

Switch 521 is connected between antenna element 510 and multiplexer 2A and connected between antenna element 510 and multiplexer 2B. Switch 521 switches a multiplexer to which antenna element 510 is to be connected, between multiplexers 2A and 2B.

Transmission amplification circuits 51T and 52T are power amplifiers that amplify power of a radio-frequency signal in a prescribed frequency band from RF signal processing circuit 530 and output power to multiplexer 2A. Transmission amplification circuits 53T and 54T are power amplifiers that amplify power of a radio-frequency signal in a prescribed frequency band from RF signal processing circuit 530 and output power to multiplexer 2B.

Reception amplification circuits 51R and 52R are low noise amplifiers that amplify power of a radio-frequency signal in a prescribed frequency band from multiplexer 2A and output power to RF signal processing circuit 530. Reception amplification circuits 53R and 54R are low noise amplifiers that amplify power of a radio-frequency signal in a prescribed frequency band from multiplexer 2B and output power to RF signal processing circuit 530.

Transmission amplification circuits 51T and 52T and reception amplification circuits 51R and 52R are connected in parallel between RF signal processing circuit 530 and multiplexer 2A. Transmission amplification circuits 53T and 54T and reception amplification circuits 53R and 54R are connected in parallel between RF signal processing circuit 530 and multiplexer 2B.

RF signal processing circuit 530 processes radio-frequency signals transmitted and received by antenna element 510. Specifically, RF signal processing circuit 530 processes a radio-frequency signal input from antenna element 510 through a reception-side signal path by down conversion and outputs the processed signal to BBIC 540. RF signal processing circuit 530 processes a transmission signal input from BBIC 540 by up conversion and output the processed signal.

The communication apparatus according to the fifth embodiment above can achieve suppressed deterioration of reception sensitivity of the multiplexer and can achieve improved communication quality.

The embodiments disclosed herein are intended also to be carried out as being combined as appropriate unless such combination is inconsistent. It should be understood that the embodiments disclosed herein are illustrative and non-restrictive in every respect. The scope of the present disclosure is defined by the terms of the claims rather than the description above and is intended to include any modifications within the scope and meaning equivalent to the terms of the claims.

What is claimed is:

1. A multiplexer comprising:
 a common terminal, a first terminal, a second terminal, and a third terminal;
 a first filter connected between the common terminal and the first terminal, the first filter having a first passband;
 a second filter connected between the common terminal and the second terminal, the second filter having a second passband not overlapping the first passband; and
 a third filter connected between the common terminal and the third terminal, the third filter having a third passband overlapping neither the first passband nor the second passband,
 with a frequency f3 being defined as M×f1±N×f2 or M×f2±N×f1, M and N being natural numbers, f1 being a frequency included in the first passband and f2 being a frequency included in the second passband, at least a part of a range of the frequency f3 overlapping the third passband,
 the first filter including
  at least one first serial arm resonance circuit connected between the common terminal and the first terminal, and a first parallel arm resonance circuit connected between the common terminal and a grounding point, the first parallel arm resonance circuit including at least one acoustic wave resonator, no acoustic wave resonator being connected between the common terminal and the first parallel arm resonance circuit, and a combined capacitance of the first parallel arm resonance circuit being higher than a minimum value of a combined capacitance of each of the at least one first serial arm resonance circuit.

2. The multiplexer according to claim 1, wherein the frequency f3 being 2×f1−f2.

3. The multiplexer according to claim 1, wherein the first parallel arm resonance circuit includes two acoustic wave resonators connected in series between the common terminal and the grounding point.

4. The multiplexer according to claim 1, wherein the first filter further includes a first impedance element connected in parallel to the first parallel arm resonance circuit, between the grounding point and the common terminal.

5. The multiplexer according to claim 1, wherein the second filter includes
at least one second serial arm resonance circuit connected between the common terminal and the second terminal, and
a second parallel arm resonance circuit connected between the common terminal and the grounding point and including at least one acoustic wave resonator,
no acoustic wave resonator being connected between the common terminal and the second parallel arm resonance circuit, and
a combined capacitance of the second parallel arm resonance circuit being higher than a minimum value of a combined capacitance of each of the at least one second serial arm resonance circuit.

6. The multiplexer according to claim 5, wherein the second parallel arm resonance circuit includes two acoustic wave resonators connected in series between the common terminal and the grounding point.

7. The multiplexer according to claim 5, wherein the second filter further includes a second impedance element connected in parallel to the second parallel arm resonance circuit, between the grounding point and the common terminal.

8. The multiplexer according to claim 1, further comprising:
a fourth terminal; and
a fourth filter connected between the common terminal and the fourth terminal, the fourth filter having a fourth passband overlapping none of the first passband, the second passband, and the third passband, wherein
the fourth passband is a frequency band between the first passband and the second passband,
the fourth filter includes
at least one third serial arm resonance circuit connected between the common terminal and the fourth terminal and
a third parallel arm resonance circuit connected between the common terminal and the grounding point and including at least one acoustic wave resonator,
no acoustic wave resonator is connected between the common terminal and the third parallel arm resonance circuit, and a combined capacitance of the third parallel arm resonance circuit being higher than a minimum value of a combined capacitance of each of the at least one third serial arm resonance circuit.

9. The multiplexer according to claim 8, wherein the third parallel arm resonance circuit includes two acoustic wave resonators connected in series between the common terminal and the grounding point.

10. The multiplexer according to claim 8, wherein the third filter further includes a third impedance element connected in parallel to the third parallel arm resonance circuit, between the grounding point and the common terminal.

11. The multiplexer according to claim 1, wherein any acoustic wave resonator included in the at least one first serial arm resonance circuit and the first parallel arm resonance circuit being a IDT electrode acoustic wave resonator that includes an IDT electrode formed from a plurality of electrode fingers, and under a condition that a duty ratio of the IDT electrode acoustic wave resonator is defined as a ratio of a width of each of the plurality of electrode fingers to a sum of the width and an interval between adjacent electrode fingers included in the plurality of electrode fingers, a duty ratio of the at least one acoustic wave resonator included in the first parallel arm resonance circuit is lower than a duty ratio of at least one acoustic wave resonator included in the first serial arm resonance circuit.

12. The multiplexer according to claim 1, further comprising:
a phase shifter connected between the common terminal and at least one of the first filter, the second filter and the third filter.

13. The multiplexer according to claim 12, further comprising:
another phase shifter connected between the second filter and the second terminal.

14. The multiplexer according to claim 1, further comprising:
means for suppressing intermodulation distortion resulting from a non-linearity of an elastic constant of the at least one acoustic wave resonator of the first parallel arm resonance circuit.

15. The multiplexer according to claim 14, wherein the means for suppressing comprises a damping capacitance of the first parallel arm resonance circuit being set higher than a damping capacitance of the at least one serial arm resonator.

16. A radio-frequency front end circuit comprising:
a multiplexer including
a common terminal, a first terminal, a second terminal, and a third terminal,
a first filter connected between the common terminal and the first terminal, the first filter having a first passband,
a second filter connected between the common terminal and the second terminal, the second filter having a second passband not overlapping the first passband, and
a third filter connected between the common terminal and the third terminal, the third filter having a third passband overlapping neither the first passband nor the second passband,
with a frequency f3 being defined as M×f1±N×f2 or M×f2±N×f1, M and N being natural numbers, f1 being a frequency included in the first passband and f2 being a frequency included in the second passband, at least a part of a range of the frequency f3 overlapping the third passband, the first filter including
- at least one first serial arm resonance circuit connected between the common terminal and the first terminal, and
- a first parallel arm resonance circuit connected between the common terminal and a grounding point, the first parallel arm resonance circuit including at least one acoustic wave resonator, no acoustic wave resonator being connected between the common terminal and the first parallel arm resonance circuit, and a combined capacitance of the first parallel arm resonance circuit being higher than a minimum value of a combined capacitance of each of the at least one first serial arm resonance circuit; and an amplification circuit electrically connected to the multiplexer.

17. The radio-frequency front end circuit according to claim 16, wherein the frequency f3 being 2×f1−f2.

18. A communication apparatus comprising:
an antenna element;
an RF signal processing circuit that processes a radio-frequency signal transmitted and received by the antenna element; and
a radio-frequency front end circuit that transmits the radio-frequency signal between the antenna element and the RF signal processing circuit, the radio-frequency front end circuit including
a multiplexer including
  a common terminal, a first terminal, a second terminal, and a third terminal,
  a first filter connected between the common terminal and the first terminal, the first filter having a first passband,
  a second filter connected between the common terminal and the second terminal, the second filter having a second passband not overlapping the first passband, and
  a third filter connected between the common terminal and the third terminal, the third filter having a third passband overlapping neither the first passband nor the second passband,
with a frequency f3 being defined as M×f1±N×f2 or M×f2±N×f1, M and N being natural numbers, f1 being a frequency included in the first passband and f2 being a frequency included in the second passband, at least a part of a range of the frequency f3 overlapping the third passband, the first filter including
- at least one first serial arm resonance circuit connected between the common terminal and the first terminal, and
- a first parallel arm resonance circuit connected between the common terminal and a grounding point, the first parallel arm resonance circuit including at least one acoustic wave resonator, no acoustic wave resonator being connected between the common terminal and the first parallel arm resonance circuit, and a combined capacitance of the first parallel arm resonance circuit being higher than a minimum value of a combined capacitance of each of the at least one first serial arm resonance circuit, and an amplification circuit electrically connected to the multiplexer.

19. The communication apparatus of claim 18, wherein the frequency f3 being 2×f1−f2.

* * * * *